(12) United States Patent
Urano et al.

(10) Patent No.: US 9,091,919 B2
(45) Date of Patent: *Jul. 28, 2015

(54) SILICONE STRUCTURE-BEARING POLYMER, RESIN COMPOSITION, AND PHOTO-CURABLE DRY FILM

(71) Applicant: SHIN-ETSU CHEMICAL CO., LTD., Tokyo (JP)

(72) Inventors: Hiroyuki Urano, Joetsu (JP); Katsuya Takemura, Joetsu (JP); Takashi Miyazaki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 124 days.

This patent is subject to a terminal disclaimer.

(21) Appl. No.: 13/751,600

(22) Filed: Jan. 28, 2013

(65) Prior Publication Data

US 2013/0196114 A1 Aug. 1, 2013

(30) Foreign Application Priority Data

Jan. 27, 2012 (JP) ................. 2012-014836

(51) Int. Cl.
| | | |
|---|---|---|
| *C08G 77/24* | (2006.01) | |
| *G03F 7/075* | (2006.01) | |
| *C09D 183/14* | (2006.01) | |
| *C08G 77/26* | (2006.01) | |
| *G03F 7/038* | (2006.01) | |
| *C08G 77/50* | (2006.01) | |
| *C08G 77/52* | (2006.01) | |
| *C08G 77/54* | (2006.01) | |
| *C08G 77/14* | (2006.01) | |
| *C09D 183/06* | (2006.01) | |
| *H05K 3/28* | (2006.01) | |

(52) U.S. Cl.
CPC .............. *G03F 7/0757* (2013.01); *C08G 77/26* (2013.01); *C09D 183/14* (2013.01); *G03F 7/0382* (2013.01); *H05K 3/287* (2013.01); *C08G 77/14* (2013.01); *C08G 77/24* (2013.01); *C08G 77/50* (2013.01); *C08G 77/52* (2013.01); *C08G 77/54* (2013.01); *C09D 183/06* (2013.01); *H05K 3/281* (2013.01); *Y10T 428/24339* (2015.01); *Y10T 428/24537* (2015.01)

(58) Field of Classification Search
CPC ........ C08G 77/24; C08G 77/50; C08G 77/52; C08G 77/53; C08G 77/14; C09D 183/06; C09D 183/24
See application file for complete search history.

(56) References Cited

U.S. PATENT DOCUMENTS

| | | |
|---|---|---|
| 3,159,601 A | 12/1964 | Ashby |
| 3,159,662 A | 12/1964 | Ashby |
| 3,220,972 A | 11/1965 | Lamoureaux |
| 3,775,452 A | 11/1973 | Karstedt |
| 6,838,229 B2 | 1/2005 | Washio et al. |
| 7,700,403 B2 | 4/2010 | Arai et al. |
| 7,785,766 B2 | 8/2010 | Kato et al. |
| 2009/0203822 A1* | 8/2009 | Shiobara et al. ............ 524/267 |

FOREIGN PATENT DOCUMENTS

| | | |
|---|---|---|
| EP | 2 083 038 A1 | 7/2009 |
| EP | 2 186 844 A1 | 5/2010 |
| JP | 2003-114531 A | 4/2003 |
| JP | 2003-192751 A | 7/2003 |
| JP | 2008-184571 A | 8/2008 |
| JP | 2009-200315 A | 9/2009 |

OTHER PUBLICATIONS

Extended European Search Report dated Jul. 29, 2013, issued in corresponding European application No. 13152717.8.

\* cited by examiner

*Primary Examiner* — Margaret Moore
(74) *Attorney, Agent, or Firm* — Westerman, Hattori, Daniels & Adrian, LLP

(57) ABSTRACT

A silicone structure-bearing polymer having a crosslinking group within the molecule, containing an isocyanurate structure bonded within the molecule, and having a Mw of 3,000-500,000 is provided. The polymer overcomes the stripping problem that a coating is stripped from metal wirings of Cu or Al, electrodes, and SiN substrates.

4 Claims, 1 Drawing Sheet

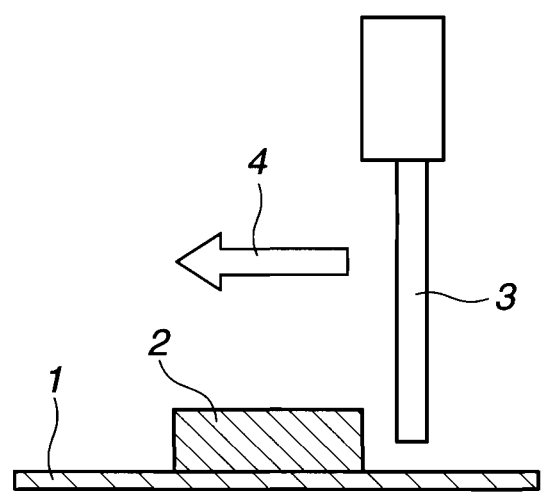

US 9,091,919 B2

SILICONE STRUCTURE-BEARING POLYMER, RESIN COMPOSITION, AND PHOTO-CURABLE DRY FILM

CROSS-REFERENCE TO RELATED APPLICATION

This non-provisional application claims priority under 35 U.S.C. §119(a) on Patent Application No. 2012-014836 filed in Japan on Jan. 27, 2012, the entire contents of which are hereby incorporated by reference.

TECHNICAL FIELD

This invention relates to a silicone structure-bearing polymer; a method for preparing the polymer; a resin composition comprising the polymer; a chemically amplified negative resist composition which can be patterned by exposure to ultraviolet radiation in near-UV and deep-UV regions having a wavelength below 500 nm such as i and g-line; a photo-curable dry film using the composition; a method of preparing the photo-curable dry film; a laminate formed using the dry film; a pattern forming process; and a film for the protection of electric/electronic parts (e.g., wirings, circuits and boards).

Patterned films of a negative resist composition are used to cover wirings, circuits, boards or the like as protective film. However, when patterns formed of negative resist composition are applied to wirings, circuit-forming metal (typically Cu) layers, metal (typically Al) electrodes on substrates, or SiN substrates (serving as dielectric substrates bearing wirings or circuits to be covered), a stripping problem often arises that the patterns are stripped from the underlying substrate owing to poor adhesion. Surprisingly, a pattern formed of a chemically amplified negative resist composition according to the invention or a dry film comprising the composition is significantly improved in adhesion to substrate.

Owing to its advantages including heat resistance, chemical resistance, insulation and flexibility, the protective film formed of the resist composition of the invention finds use as dielectric film for semiconductor devices including redistribution, dielectric film for multilayer printed boards, solder mask, cover lay film, dielectric film for filling in through-silicon vias (TSV), and lamination of substrates.

BACKGROUND ART

As most electronic equipment including personal computers, digital cameras and mobile phones become of smaller size and better performance, there is an increasing demand for semiconductor devices of small size, thin profile and high density. There is a desire to have a photosensitive dielectric material which can accommodate an increase of substrate area for productivity improvement and which can accommodate structures having fine asperities with a high aspect ratio on substrates in the high-density packaging technology as typified by chip size packages or chip scale packages (CSP) or 3D layer stacks.

With respect to the photosensitive dielectric material mentioned above, JP-A 2008-184571 discloses a photo-curable resin composition which can be coated to form films having a widely varying thickness by the spin coating technique commonly used in the semiconductor device fabrication, processed into fine size patterns using radiation of a wide wavelength range, and post-cured at low temperatures into electric/electronic part-protecting films having flexibility, heat resistance, electric properties, adhesion, reliability and chemical resistance. Advantageously, the spin coating technique is capable of simply forming a film on a substrate. This photo-curable resin composition for forming electric/electronic part-protecting films is used to form a film having a thickness of 1 to 100 µm on a substrate. As the film thickness increases beyond 30 µm, it becomes difficult to apply the photo-curable resin composition onto the substrate by spin coating because the composition must have a very high viscosity. The film formation on substrate by spin coating encounters a certain limit in the practical application.

Also, when the photo-curable resin composition is applied onto a substrate having a rugged surface by spin coating, it is difficult to form a uniform layer on the substrate. The photo-curable resin layer tends to leave voids near steps on the substrate. Further improvements in planarity and step coverage are desired. Another coating technique replacing the spin coat technique is spray coating as disclosed in JP-A 2009-200315. Owing to the principle of spraying, defects are often formed including height difference arising from asperities on the substrate, film rupture at pattern edges and pinholes at recess bottom. The problems of planarity and step coverage still remain unsolved.

Recently, in the high-density package technology as typified by chip scale packages (CSP) or 3D stacked packages, a focus is put on the technique of redistribution from chips by forming a fine, high aspect ratio pattern on a substrate and depositing a metal such as copper on the pattern. To meet a demand for chips of higher density and higher integration, it is strongly desired to reduce the width of pattern lines and the size of contact holes for interconnection between substrates. The lithography is generally used for forming fine size patterns. In particular, the lithography combined with chemically amplified resist compositions is best suited for forming fine pattern features. Since the pattern used for redistribution is permanently left between device chips, the pattern material must have a cure ability and also serve as an electric/electronic part-protecting film having flexibility, heat resistance, electric properties, adhesion, reliability and chemical resistance. For this reason, a negative resist composition is believed suitable for forming such patterns as described in JP-A 2003-114531.

Accordingly, a chemically amplified negative resist composition is typical of the pattern-forming material which can be processed into a fine redistribution layer and serve as an electric/electronic part-protecting film having flexibility, heat resistance, electric properties, adhesion, reliability and chemical resistance.

On the other hand, a chemically amplified negative resist composition can form a fine pattern as used in the redistribution technology and is useful as electric/electronic part-protecting film. The negative resist composition is thus often used to cover Cu wirings preformed on substrates, Al electrodes on substrates, or dielectric or SiN substrates having wirings or electrodes formed thereon. Sometimes, the negative resist composition must entirely cover the SiN substrate. Since the adhesion between the coating layer of the negative resist composition and the substrate is still insufficient, a stripping problem often arises that the coating layer is stripped from the substrate.

Accordingly, to meet a demand for chips of higher density and higher integration, the chemically amplified negative resist composition which can form a fine size pattern for redistribution and is suitable as electric/electronic part-protecting film is strongly desired to improve the adhesion to substrate.

CITATION LIST

Patent Document 1: JP-A 2008-184571 (U.S. Pat. No. 7,785, 766)
Patent Document 2: JP-A 2009-200315 (U.S. Pat. No. 7,700, 403)
Patent Document 3: JP-A 2003-114531 (U.S. Pat. No. 6,838, 229)

SUMMARY OF INVENTION

A first object of the invention is to provide a chemically amplified negative resist composition which is suitable to form a fine size pattern and effective for overcoming the stripping problem that can be encountered on wirings and electrodes of metal (e.g., Cu or Al), semiconductor substrates and SiN substrates; a silicone structure-bearing polymer suitable for use therein and a method of preparing the polymer; a resin composition comprising the polymer.

A second object is to provide a photo-curable dry film comprising the resin composition, a method of preparing the dry film, and a laminate formed using the dry film.

A third object is to provide a pattern forming process of forming a fine size pattern simply by spin coating the resist composition onto a substrate; and a pattern forming process capable of forming a resist layer having a widely varying thickness even on a substrate having a rugged surface, using the photo-curable dry film.

A fourth object is to provide a protective film for electric and electronic parts such as wirings, circuits and boards, comprising a cured film obtained by post-curing at low temperature the pattern resulting from the pattern forming process.

The inventors have found that a chemically amplified negative resist composition in the form of a resin composition comprising (A) a silicone structure-bearing polymer having a crosslinking group or a reaction site susceptible to crosslinking reaction within the molecule, containing an isocyanurate structure bonded within the molecule or to a terminal group, and having a weight average molecular weight of 3,000 to 500,000, preferably comprising recurring units having formula (1) defined below, (B) a crosslinker, (C) a photoacid generator which is decomposed to generate an acid upon exposure to radiation of wavelength 190 to 500 nm, and (D) a solvent can form a fine pattern, and substantially overcomes the stripping problem that can be encountered on wirings and electrodes of metal (e.g., Cu or Al), semiconductor substrates and SiN substrates. The cured film resulting from the pattern forming process using the composition is useful as an electric/electronic part-protecting film.

Embodiments of the invention are defined below.

[1] A silicone structure-bearing polymer having a crosslinking group or a reaction site susceptible to crosslinking reaction within the molecule, containing an isocyanurate structure bonded within the molecule or to a terminal group, and having a weight average molecular weight of 3,000 to 500,000.

[2] The polymer of [1] wherein the isocyanurate structure is a divalent organic group having the general formula (4-1) and/ or a monovalent organic group having the general formula (4-2):

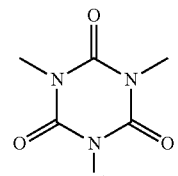

(4-1)

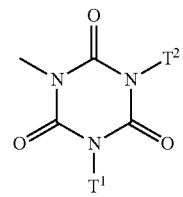

(4-2)

wherein $T^1$ and $T^2$ are each independently a monovalent group selected from the group consisting of —H, —CH$_2$—CH—CH$_2$ (with epoxide O), —CH$_2$CH$_2$CH$_2$Si(R$^9$)$_3$, and —CH$_2$R$^{10}$, $R^9$ is a $C_1$-$C_4$ alkyl or alkoxy group, and $R^{10}$ is hydrogen, a $C_1$-$C_4$ alkyl or alkoxy group, or —(CH$_2$)$_s$OH wherein s is an integer of 0 to 3.

[3] The polymer of [1] or [2], comprising recurring units having the general formula (1).

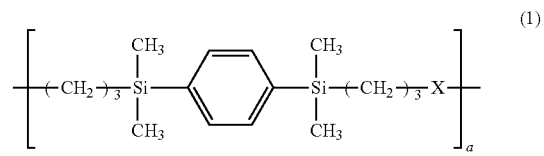

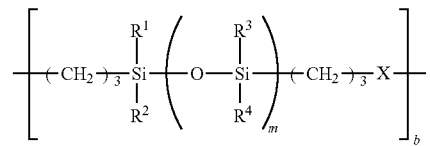

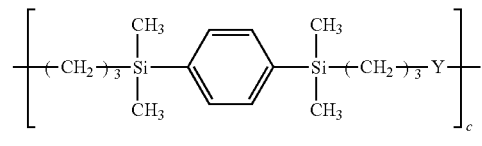

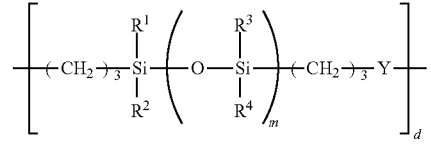

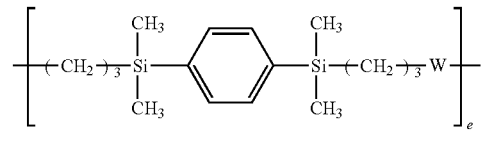

(1)

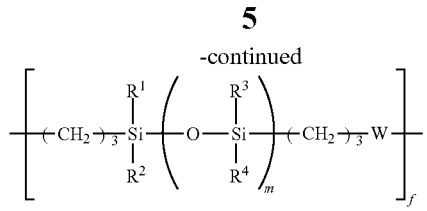

Herein $R^1$ to $R^4$ are each independently a monovalent $C_1$-$C_8$ hydrocarbon group, m is an integer of 1 to 100, a, b, c and d are each independently 0 or a positive number, e and f each are a positive number, with the proviso that a, b, c and d are not equal to 0 at the same time and a+b+c+d+e+f=1.

X is a divalent organic group having the general formula (2):

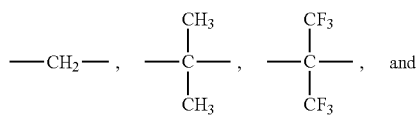

wherein Z is a divalent organic group selected from the group consisting of

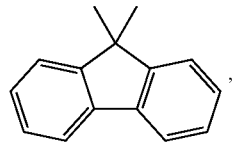

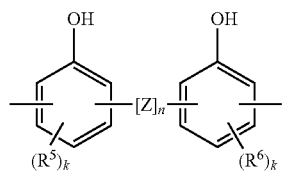

n is 0 or 1, $R^5$ and $R^6$ are each independently a $C_1$-$C_4$ alkyl or alkoxy group, k is 0, 1 or 2.

Y is a divalent organic group having the general formula (3):

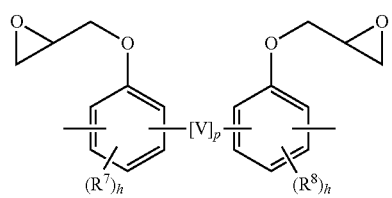

wherein V is a divalent organic group selected from the group consisting of

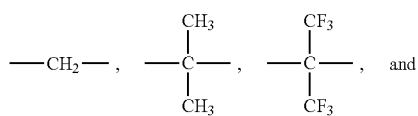

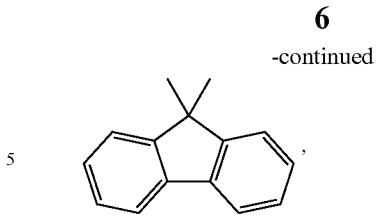

p is 0 or 1, $R^7$ and $R^8$ are each independently a $C_1$-$C_4$ alkyl or alkoxy group, h is 0, 1 or 2.

W is a divalent organic group having the general formula (4-1) and/or a monovalent organic group having the general formula (4-2):

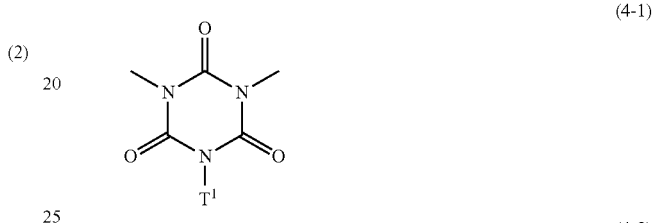

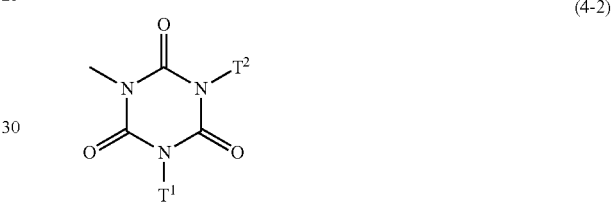

wherein $T^1$ and $T^2$ are each independently a monovalent group selected from the group consisting of

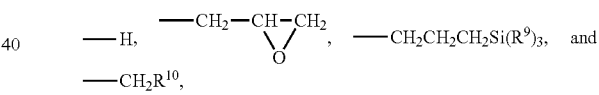

$R^9$ is a $C_1$-$C_4$ alkyl or alkoxy group, and $R^{10}$ is hydrogen, a $C_1$-$C_4$ alkyl or alkoxy group, or —(CH$_2$)$_s$OH wherein s is an integer of 0 to 3.

[4] The polymer of [2] or [3] wherein $T^1$ or $T^2$ in formulae (4-1) and (4-2) has the following formula.

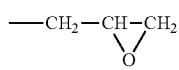

[5] A method for preparing the silicone structure-bearing polymer of [3], comprising the step of effecting polymerization reaction of hydrogensilphenylene having the formula (5):

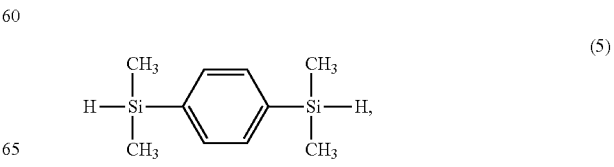

a dihydroorganosiloxane having the formula (6):

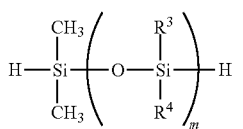
(6)

wherein $R^3$, $R^4$ and m are as defined above, a diallyl-containing epoxy compound having the formula (7):

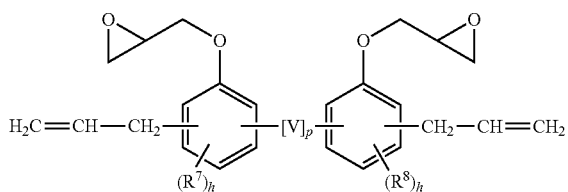
(7)

wherein V, $R^7$, $R^8$, p and h are as defined above, and/or a diallyl-containing phenol compound having the formula (8):

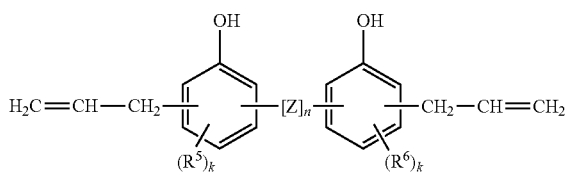
(8)

wherein Z, $R^5$, $R^6$, n and k are as defined above, and a diallyl-containing isocyanurate structure compound having the formula (9) and/or an allyl-containing isocyanurate structure compound having the formula (10):

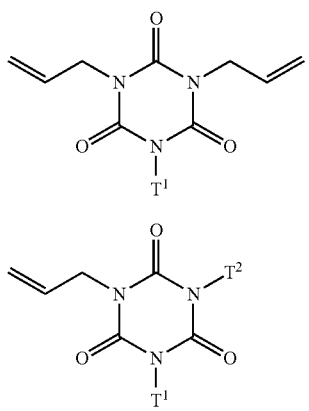

wherein $T^1$ and $T^2$ are as defined above in the presence of a catalyst.

[6] The method of [5] wherein the isocyanurate structure compound is used in an amount of 0.1 to 10.0% by weight based on the total weight of the silicone polymer-forming reactants.

[7] A resin composition comprising
  (A) the silicone structure-bearing polymer of any one of [1] to [4],
  (B) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group,
  (C) a photoacid generator which is decomposed to generate an acid upon exposure to radiation of wavelength 190 to 500 nm, and
  (D) a solvent.

[8] A chemically amplified negative resist composition comprising the resin composition of [7].

[9] A photo-curable dry film comprising a photo-curable resin layer having a thickness of 10 to 100 μm sandwiched between a support film and a protective film, the photo-curable resin layer being formed of a photo-curable resin composition which is the resin composition of [7].

[10] A pattern forming process comprising the steps of:
  (1) coating the chemically amplified negative resist composition of [8] onto a substrate, and prebaking to form a resist film,
  (2) exposing the resist film to high-energy radiation of wavelength 190 to 500 nm or electron beam through a photomask,
  (3) baking and developing in a developer to pattern the resist film.

[11] The process of [10], further comprising (4) post-curing the patterned resist film resulting from development step (3) at a temperature of 100 to 250° C.

[12] A laminate comprising a substrate provided with grooves and/or holes having an opening width of 10 to 100 μm and a depth of 10 to 120 μm, and a layer lying on the substrate, the layer being a cured layer of the photo-curable resin composition extracted from the photo-curable dry film of [9].

[13] A method of preparing a photo-curable dry film, comprising the steps of:
  (i) coating the resin composition of [7] onto a support film,
  (ii) drying the resin composition to form a photo-curable resin layer on the support film, and
  (iii) applying a protective film onto the photo-curable resin layer.

[14] A pattern forming process comprising the steps of:
  (i) stripping the protective film from the photo-curable dry film of [9] and placing the bare photo-curable resin layer in close contact with a substrate,
  (ii) exposing the photo-curable resin layer to radiation of wavelength 190 to 500 nm through a photomask and through the support film or with the support film stripped off,
  (iii) post-exposure bake, and
  (iv) developing in a developer to pattern the layer.

[15] The process of [14], further comprising (v) post-curing the patterned layer resulting from development step (iv) at a temperature of 100 to 250° C.

[16] The process of [14] or [15] wherein the substrate is provided with grooves and/or holes having an opening width of 10 to 100 μm and a depth of 10 to 120 μm.

[17] An electric/electronic part protective film comprising the cured film obtained by the process of [15].

ADVANTAGEOUS EFFECTS OF INVENTION

The chemically amplified negative resist composition substantially overcomes the stripping problem that can be encountered on wirings and electrodes of metal (e.g., Cu or Al), semiconductor substrates and SiN substrates. The chemically amplified negative resist composition, photo-curable dry film and pattern forming process according to the invention can form a fine pattern using radiation over a wide span of wavelength, can reduce the size of pattern features in the redistribution technology to meet the demand for chips of higher density and higher integration, and are useful to form an electric/electronic part-protecting film.

BRIEF DESCRIPTION OF DRAWINGS

The only FIGURE, FIG. 1 schematically illustrates how to examine adhesion in Examples.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
PAG: photoacid generator Silicone Structure-Bearing Polymer One embodiment of the invention is a silicone structure-bearing polymer having a crosslinking group or a reaction site susceptible to crosslinking reaction within the molecule. An isocyanurate structure is bonded within the molecule or to a terminal group. The polymer has a weight average molecular weight (Mw) of 3,000 to 500,000.

The isocyanurate structure is preferably a divalent organic group having the general formula (4-1) or a monovalent organic group having the general formula (4-2). They are used singly or in combination.

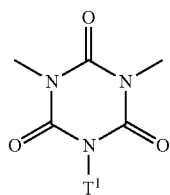

(4-1)

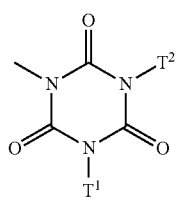

(4-2)

Herein $T^1$ and $T^2$ are each independently a monovalent group selected from the following.

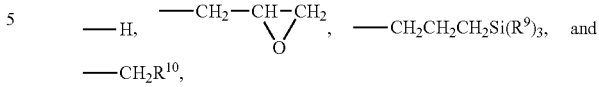

$R^9$ is a $C_1$-$C_4$ alkyl or alkoxy group, and $R^{10}$ is hydrogen, a $C_1$-$C_4$ alkyl or alkoxy group, or —$(CH_2)_s$OH wherein s is an integer of 0 to 3.

Specifically, the polymer is defined as comprising recurring units having the general formula (1).

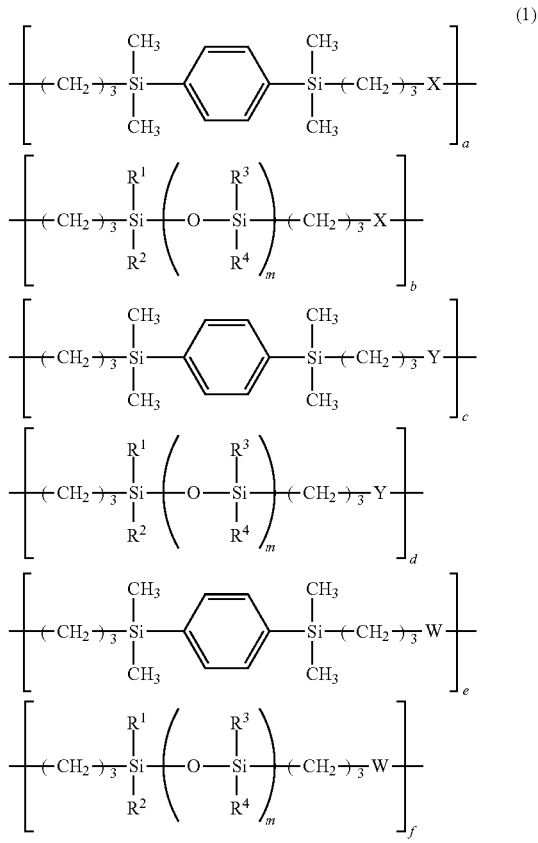

(1)

In formula (1), each of $R^1$ to $R^4$, which may be the same or different, stands for a monovalent hydrocarbon group having 1 to 8 carbon atoms, and preferably 1 to 6 carbon atoms. Examples include straight, branched or cyclic alkyl groups such as methyl, ethyl, propyl, isopropyl, n-butyl, tert-butyl, and cyclohexyl, straight, branched or cyclic alkenyl groups such as vinyl, allyl, propenyl, butenyl, hexenyl, and cyclohexenyl, aryl groups such as phenyl and tolyl, and aralkyl groups such as benzyl and phenylethyl.

From the standpoints of compatibility with a crosslinking agent and a photoacid generator to be described later and photo-curability, m is an integer of 1 to 100, preferably 1 to 80. From the standpoints of substrate adhesion, electrical properties, and reliability, a, b, c and d each are 0 or a positive number, e and f each are a positive number, with the proviso that a, b, c and d are not equal to 0 at the same time. Preferably, these subscripts satisfy the range: $0 \leq a \leq 0.8$, more preferably $0.2 \leq a < 0.8$, and even more preferably $0.2 \leq a \leq 0.7$; $0 \leq b < 1.0$, more preferably $0.1 \leq b < 0.8$, and even more preferably $0.1 \leq b \leq 0.5$; $0 \leq c \leq 0.5$, more preferably $0 \leq c \leq 0.4$; $0 \leq d \leq 0.3$, more preferably $0 \leq d \leq 0.2$; $0 < e \leq 0.3$, more preferably $0 < e \leq 0.2$; $0 < f \leq 0.3$, more preferably $0 < f \leq 0.2$, provided that $a+b+c+d+e+f=1$.

More specifically, these subscripts satisfy the preferred range (i): $0.2 \leq a < 0.8$, $0.1 \leq b < 0.8$, $c=d=0$, $0 < e \leq 0.3$, and $0 < f \leq 0.3$; or the preferred range (ii): $0.2 \leq a \leq 0.7$, $0.1 \leq b \leq 0.5$, $0 < c \leq 0.4$, $0 < d \leq 0.2$, $0 < e \leq 0.2$, and $0 < f \leq 0.2$.

X is a divalent organic group having the general formula (2).

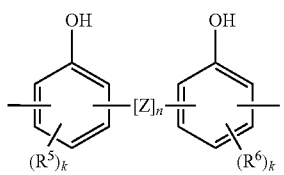

(2)

Herein Z is a divalent organic group selected from

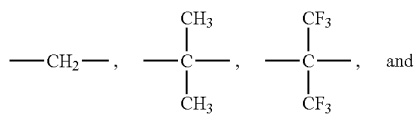
and
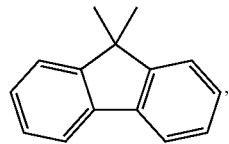

n is 0 or 1, $R^5$ and $R^6$ are each independently a $C_1$-$C_4$ alkyl or alkoxy group, and k is 0, 1 or 2. Examples of $R^5$ and $R^6$ include methyl, ethyl, isopropyl, tert-butyl, methoxy, ethoxy, and isopropyloxy.

Y is a divalent organic group having the general formula (3).

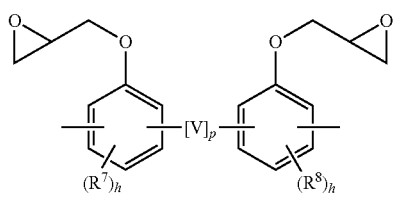

(3)

Herein V is a divalent organic group selected from

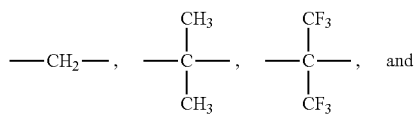
and
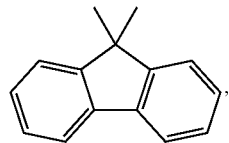

p is 0 or 1, $R^7$ and $R^8$ are each independently a $C_1$-$C_4$ alkyl or alkoxy group, and h is 0, 1 or 2. Examples of $R^7$ and $R^8$ are as exemplified for $R^5$ and $R^6$.

W is a divalent organic group having the general formula (4-1) and/or a monovalent organic group having the general formula (4-2):

(4-1)

(4-2)

Herein $T^1$ and $T^2$ are each independently a monovalent group selected from

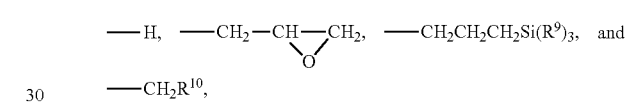

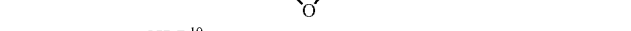

$R^9$ is a $C_1$-$C_4$ alkyl or alkoxy group, and $R^{10}$ is hydrogen, a $C_1$-$C_4$ alkyl or alkoxy group, or —$(CH_2)_s$OH wherein s is 0, 1, 2 or 3. Examples of $R^9$ are as exemplified for $R^5$ and $R^6$. Examples of $R^{10}$ include the same as exemplified for $R^5$ and $R^6$ as well as hydroxyl, methylol, and hydroxyethyl groups.

Most preferably, $T^1$ and $T^2$ each are the following substituent group.

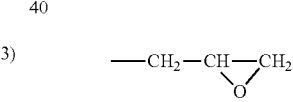

The silicone structure-bearing polymer should have a weight average molecular weight (Mw) of 3,000 to 500,000 and preferably 5,000 to 300,000, from the standpoints of compatibility and photo-curability of a composition comprising the polymer as well as mechanical properties of the cured composition. It is noted that Mw is determined by GPC versus polystyrene standards.

The silicone structure-bearing polymer may be prepared by providing suitable reactants and subjecting them to polymerization reaction, known as "hydrosilylation" reaction, in the presence of a catalyst. The reactants include hydrogensilphenylene, specifically 1,4-bis(dimethylsilyl)benzene, having the formula (5):

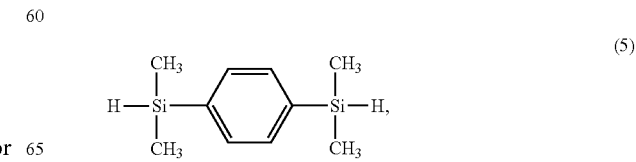

(5)

a dihydroorganosiloxane having the formula (6):

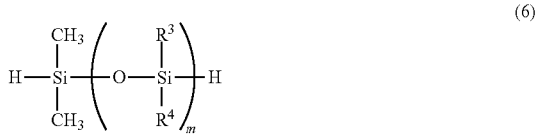

wherein $R^3$, $R^4$ and m are as defined above, a diallyl-containing epoxy compound having the formula (7):

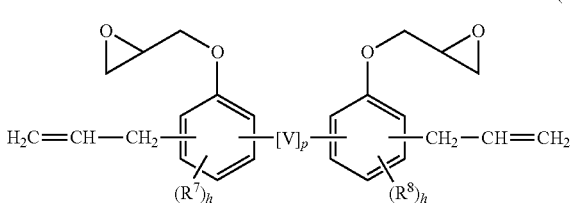

wherein V, $R^7$, $R^8$, p and h are as defined above, and/or a diallyl-containing phenol compound having the formula (8):

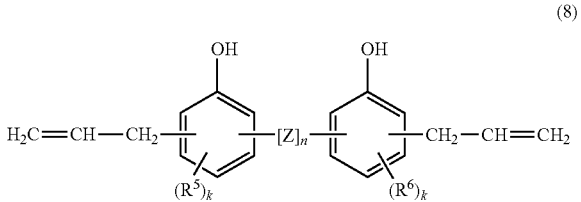

wherein Z, $R^5$, $R^6$, n and k are as defined above, and a diallyl-containing isocyanurate structure compound having the formula (9) and/or a monoallyl-containing isocyanurate structure compound having the formula (10):

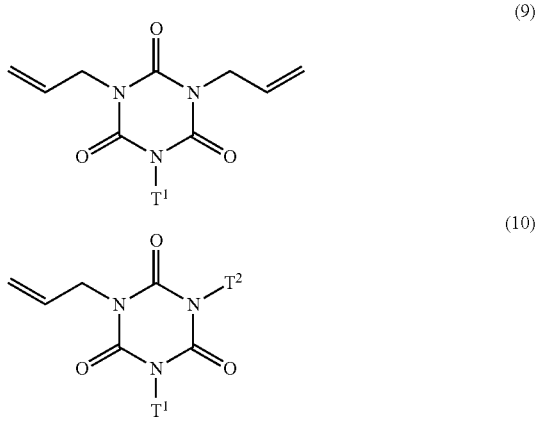

wherein $T^1$ and $T^2$ are as defined above. Typically the isocyanurate structure compound is used in an amount of 0.1 to 10.0% by weight based on the total weight of the silicone polymer-forming reactants. It is preferred that the epoxy compound of formula (7) and the phenol compound of formula (8) be used in combination.

The Mw of the silicone structure-bearing polymer may be easily controlled by adjusting a ratio of the total number of allyl groups on the diallyl-containing epoxy compound of formula (7), the diallyl-containing phenol compound of formula (8) and the diallyl or monoallyl-containing isocyanurate structure compound of formula (9) or (10), to the total number of hydrosilyl groups on the hydrogensilphenylene of formula (5) and the dihydroorganosiloxane of formula (6) (i.e., total allyl/total hydrosilyl ratio). Alternatively, a polymer having the desired molecular weight may be produced by effecting polymerization of the diallyl-containing epoxy compound, diallyl-containing phenol compound and (di)allyl-containing isocyanurate compound with the hydrogensilphenylene and dihydroorganosiloxane while using a monoallyl compound (e.g., o-allylphenol), a monohydrosilane (e.g., triethylhydrosilane) or monohydrosiloxane as a molecular weight modifier.

The catalysts which can be used in the polymerization reaction include platinum group metal elements such as platinum (inclusive of platinum black), rhodium and palladium; platinum chloride, chloroplatinic acid and chloroplatinic acid salts such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$, and $Na_2HPtCl_4.xH_2O$ wherein x is specifically an integer of 0 to 6, more specifically 0 or 6; alcohol-modified chloroplatinic acid as described in U.S. Pat. No. 3,220,972; complexes of chloroplatinic acid with olefins as described in U.S. Pat. No. 3,159,601, U.S. Pat. No. 3,159,662 and U.S. Pat. No. 3,775,452; platinum group metals such as platinum black and palladium on supports such as alumina, silica and carbon; rhodium-olefin complexes; chlorotris(triphenyl-phosphine)rhodium, known as Wilkinson catalyst; and complexes of platinum chloride, chloroplatinic acid or chloroplatinic acid salts with vinyl-containing siloxanes (specifically, vinyl-containing cyclic siloxanes).

The catalyst is used in a catalytic amount, specifically 0.001 to 0.1% by weight of platinum group metal based on the total weight of reactants for polymerization reaction.

If desired, a solvent may be used in the polymerization reaction. Suitable solvents include hydrocarbon solvents such as toluene and xylene.

With respect to polymerization conditions, the polymerization temperature is preferably in the range of 40 to 150° C., and more preferably 60 to 120° C. At temperatures within the range, polymerization can be completed within a short time and the catalyst is not deactivated. The polymerization time may vary with the type and amount of a desired polymer. Preferably polymerization is completed within 0.5 to 100 hours, and more preferably 0.5 to 30 hours, in order to prevent moisture entry into the polymerization system. At the end of polymerization, the solvent is distilled off if the solvent is used. In this way, a silicone structure-bearing polymer having an isocyanurate structure within the molecule or as a terminal group, represented by formula (1) is obtained.

As the Mw of a silicone structure-bearing polymer lowers, its viscosity also lowers. As a result, a resin layer formed of a chemically amplified negative resist composition comprising that silicone structure-bearing polymer also lowers its viscosity. If a proportion of linear polysiloxane-containing molecular units (corresponding to units (b), (d) and (f) in formula (1)) in the molecule of a silicone structure-bearing polymer increases, a proportion of aromatic compound-containing molecular units, typically silphenylene-containing molecular units (corresponding to units (a), (c) and (e) in formula (1)) relatively decreases. Then the silicone structure-bearing polymer lowers its viscosity. As a result, a resin layer formed of a chemically amplified negative resist composition comprising that silicone structure-bearing polymer also lowers its viscosity. If the linear polysiloxane in the molecule of a silicone structure-bearing polymer increases its molecular chain length, that is, if the value of m in formula (1) increases, the silicone structure-bearing polymer lowers its viscosity. As a result, a resin layer formed of a chemically amplified negative resist composition comprising that silicone structure-bearing polymer may also lower its viscosity.

Resin Composition and Chemically Amplified Negative Resist Composition

Another embodiment of the invention is a resin composition comprising (A) the silicone structure-bearing polymer defined above, (B) at least one crosslinker selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group, (C) a photoacid generator which is decomposed to generate an acid upon exposure to radiation of wavelength 190 to 500 nm, and (D) a solvent.

Also contemplated herein is a chemically amplified negative resist composition which is constructed by the resin composition.

Component (B) is a crosslinker which is preferably one or more members selected from the group consisting of an amino condensate modified with formaldehyde or formaldehyde-alcohol, a phenol compound having on the average at least two methylol or alkoxymethylol groups in the molecule, and a polyhydric phenol compound having a hydroxyl group substituted by a glycidoxy group.

The amino condensate modified with formaldehyde or formaldehyde-alcohol includes, for example, melamine condensates modified with formaldehyde or formaldehyde-alcohol, and urea condensates modified with formaldehyde or formaldehyde-alcohol.

The modified melamine condensates are prepared, for example, by modifying a melamine monomer with formaldehyde into a methylol form in a well-known manner, and optionally, further modifying it with an alcohol into an alkoxy form, thereby yielding a modified melamine of the general formula (11) shown below. The alcohols used herein are lower alcohols, for example, alcohols having 1 to 4 carbon atoms.

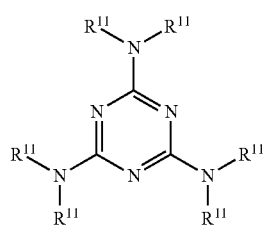

(11)

Herein, $R^{11}$, which may be the same or different, is a methylol group, an alkoxymethyl group containing a $C_1$-$C_4$ alkoxy moiety, or hydrogen, and at least one $R^{11}$ is a methylol or alkoxymethyl group. Specifically, $R^{11}$ is a methylol group, an alkoxymethyl group such as methoxymethyl or ethoxymethyl, or hydrogen.

Illustrative, non-limiting, examples of the modified melamine of formula (11) include trimethoxymethylmonomethylolmelamine, dimethoxymethylmonomethylolmelamine, trimethylolmelamine, hexamethylolmelamine, and hexamethoxymethylolmelamine.

Next, the modified melamine of formula (11) or an oligomer thereof (e.g., dimer or trimer) is subjected to addition condensation polymerization with formaldehyde in a customary way until a desired molecular weight is reached, thereby obtaining the formaldehyde or formaldehyde-alcohol-modified melamine condensate as component (B).

Also, the urea condensates modified with formaldehyde or formaldehyde-alcohol are prepared, for example, by modifying a urea condensate having a desired molecular weight with formaldehyde into a methylol form in a well-known manner, and optionally, further modifying it with an alcohol into an alkoxy form.

Illustrative examples of the modified urea condensate include methoxymethylated urea condensates, ethoxymethylated urea condensates, and propoxymethylated urea condensates. These modified melamine condensates and modified urea condensates may be used alone or in admixture of two or more.

Examples of the phenol compound having on the average at least two methylol or alkoxymethylol groups in a molecule include (2-hydroxy-5-methyl)-1,3-benzenedimethanol and 2,2',6,6'-tetramethoxymethylbisphenol A. These phenol compounds may be used alone or in admixture of two or more as the crosslinker.

Examples of the polyhydric phenol compound having a hydroxyl group substituted by a glycidoxy group include 1,1'-diglycidoxybisphenol A, tris(4-glycidoxyphenyl)methane, or 1,1,1-tris(4-glycidoxyphenyl)ethane which are obtained by reacting hydroxyl groups of bisphenol A, tris(4-hydroxyphenyl)methane, and 1,1,1-tris(4-hydroxyphenyl)ethane with epichlorohydrin in the presence of a base, respectively. These glycidoxy-substituted phenol compounds may also be used alone or in admixture of two or more as the crosslinker.

The crosslinker induces curing reaction with the silicone structure-bearing polymer for facilitating pattern formation and augmenting the strength of a cured product. The crosslinker should preferably have a weight average molecular weight (Mw) of 150 to 10,000, and more preferably 200 to 3,000, from the standpoints of photo-curability and heat resistance.

It is preferred from the standpoints of photo-curability and reliability of a protective film after post-curing that the crosslinker be used in an amount of 0.5 to 50 parts, and especially 1 to 30 parts by weight per 100 parts by weight of the silicone structure-bearing polymer (A).

The photoacid generator (C) is typically a compound which generates an acid upon exposure to light with a wavelength of 190 to 500 nm, the acid generated serving as a curing catalyst. Since the photo-curable resin composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Exemplary onium salts are compounds of the following general formula (12).

$$(R^{12})_j M^+ K^- \qquad (12)$$

Herein, $R^{12}$ is a straight, branched or cyclic $C_1$-$C_{12}$ alkyl group, $C_6$-$C_{12}$ aryl group or $C_7$-$C_{12}$ aralkyl group, which may have a substituent; $M^+$ is iodonium or sulfonium; $K^-$ is a non-nucleophilic counter-ion; and j is 2 or 3.

Illustrative examples of alkyl groups represented by $R^{12}$ include methyl, ethyl, propyl, butyl, cyclohexyl, 2-oxocyclohexyl, norbornyl, and adamantyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary aralkyl groups include benzyl and phenethyl.

Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Exemplary diazomethane derivatives are compounds of the following general formula (13).

(13)

Herein, $R^{13}$, which may be the same or different, is a straight, branched or cyclic $C_1$-$C_{12}$ alkyl or haloalkyl group, $C_6$-$C_{12}$ aryl or haloaryl group, or $C_7$-$C_{12}$ aralkyl group.

Illustrative examples of alkyl groups represented by $R^{13}$ include methyl, ethyl, propyl, butyl, amyl, cyclopentyl, cyclohexyl, norbornyl, and adamantyl. Exemplary haloalkyl groups include trifluoromethyl, 1,1,1-trifluoroethyl, 1,1,1-trichloroethyl, and nonafluorobutyl. Exemplary aryl groups include phenyl; alkoxyphenyl groups such as o-, m- or p-methoxyphenyl, ethoxyphenyl, m- or p-tert-butoxyphenyl; and alkylphenyl groups such as 2-, 3- or 4-methylphenyl, ethylphenyl, 4-tert-butylphenyl, 4-butylphenyl, and dimethylphenyl. Exemplary haloaryl groups include fluorophenyl, chlorophenyl, and 1,2,3,4,5-pentafluorophenyl. Exemplary aralkyl groups include benzyl and phenethyl.

Illustrative examples of the PAG include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethane-sulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate;

diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene;

imido-yl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide;

iminosulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2[(4-methylphenyl)sulfonyl]-1-[(4-methylthio)-phenyl]-1-propane.

Among others, imido-yl sulfonates, imino sulfonates and oxime sulfonates are preferred.

The PAGs may be used alone or in admixture of two or more. It is preferred from the standpoints of photo-absorption of the PAG itself and photo-curability of a thick film that the PAG be added in an amount of 0.05 to 20 parts by weight, and especially 0.2 to 5 parts by weight, per 100 parts by weight of the silicone structure-bearing polymer.

The solvent (D) used herein may be any organic solvent in which the silicone structure-bearing polymer (A), crosslinker (B) and PAG (C) are soluble. Illustrative, non-limiting, examples of the organic solvent include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. These solvents may be used alone or in combinations of two or more thereof. Of these solvents, preferred are ethyl lactate, cyclohexanone, cyclopentanone, PGMEA, γ-butyrolactone, and mixtures thereof, in which the PAG is most soluble.

It is preferred from the standpoints of compatibility, viscosity and ease of coating of the resulting resin composition that the solvent (D) be used in an amount of 50 to 2,000 parts, and especially 100 to 1,000 parts by weight per 100 parts by weight of components (A) to (C) combined.

If desired, (E) a basic compound may be added to the resin composition. The basic compound used herein is preferably a compound capable of suppressing the rate of diffusion when the acid generated by the PAG diffuses within the photocurable resin layer. The inclusion of the basic compound improves resolution, suppresses changes in sensitivity following exposure and reduces substrate and environment dependence, as well as improving the exposure latitude and the pattern profile.

Examples of the basic compound include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogenous compounds, amide derivatives, imide derivatives, and compound of the general formula (14).

$$N(\alpha)_q(\beta)_{3-q} \quad (14)$$

Herein, q is equal to 1, 2 or 3; side chain β is independently hydrogen or a straight, branched or cyclic $C_1$-$C_{20}$ alkyl group which may contain an ether bond or hydroxyl group; and side chain α is independently selected from substituent groups of the following general formulas (15) to (17), and two or three α's may bond together to form a ring.

  (15)

  (16)

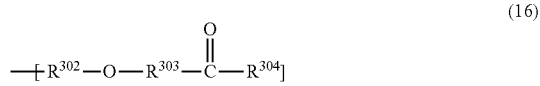  (17)

In the formulas, $R^{300}$, $R^{302}$ and $R^{305}$ are each independently a straight or branched $C_1$-$C_4$ alkylene group. $R^{301}$ and $R^{304}$ are each independently hydrogen, a straight, branched or cyclic $C_1$-$C_{20}$ alkyl group which may contain at least one hydroxyl group, ether bond, ester bond or lactone ring. $R^{303}$ is a single bond or a straight or branched $C_1$-$C_4$ alkylene group. $R^{306}$ is a straight, branched or cyclic $C_1$-$C_{20}$ alkyl group which may contain at least one hydroxyl group, ether bond, ester bond or lactone ring.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds with sulfonyl group include 3-pyridinesulfonic acid and pyridinium p-toluenesulfonate.

Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

Examples of the compounds of formula (14) include tris [2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl] ethylamine, N,N-bis(2-acetoxyethyl)-2-[(2-oxotetrahydrofuran-3-yl)oxy-carbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl) bis[2-(methoxycarbonyl)ethyl]amine, N-(2-acetoxyethyl)bis [2-(methoxycarbonyl)ethyl]amine, N-(2-hydroxyethyl)bis [2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl)amine, N-butylbis (methoxycarbonylmethyl)amine, N-hexylbis (methoxycarbonylmethyl)amine, and β-(diethylamino)-δ-valerolactone.

The basic compounds may be used alone or in admixture of two or more. From the standpoint of sensitivity, the basic compound may be formulated in an amount of 0 to 3 parts, and preferably 0.01 to 1 part by weight per 100 parts by weight of the silicone structure-bearing polymer.

In addition to the aforementioned components, the photo-curable resin composition of the invention may include optional components. Suitable additives include a surfactant which is commonly used for improving the coating characteristics, and a light absorber which is commonly used for improving light absorption efficiency of photoacid generators or the like.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad FC-4430 from Sumitomo 3M Ltd., Surflon S-141 and S-145 from Asahi Glass Co., Ltd., Unidyne DS-401, DS-4031, and DS-451 from Daikin Industries Ltd., Megaface F-8151 from DIC Corp., and X-70-093 from Shin-Etsu Chemical Co., Ltd. Preferred surfactants include Fluorad FC-4430 from Sumitomo 3M Ltd. and X-70-093 from Shin-Etsu Chemical Co., Ltd.

Exemplary light absorbers include diaryl sulfoxides, diaryl sulfones, 9,10-dimethylanthracene and 9-fluorenone.

The photo-curable resin composition or chemically amplified resist composition of the invention is prepared in a conventional way. For example, it can be prepared by agitating and mixing the aforementioned components and optional additives in the solvent and passing the mixture through a filter.

Photo-Curable Dry Film

A further embodiment of the invention is a photo-curable dry film comprising a photo-curable resin layer sandwiched between a support film and a protective film. The photo-curable resin layer is formed of the photo-curable resin composition defined above.

First, the structure of the photo-curable dry film is described. The photo-curable dry film includes a support film, a protective film, and a photo-curable resin layer sandwiched therebetween. The photo-curable resin layer of the photo-curable resin composition is suitable for forming an electric/electronic part-protective film. The photo-curable dry film enables to form a resin layer having a widely varying thickness and to form a fine pattern, and post-cure at low temperature leads to improvements in flexibility, heat resistance, electric properties, adhesion, reliability and chemical resistance.

The photo-curable dry film is solid, and eliminates the risk that after the photo-curable resin layer is cured, bubbles resulting from volatilization are left within the resin layer and between the resin layer and the rugged substrate surface. Although the advancement of semiconductor devices toward small size, thin profile and multilayer stacking brings in the tendency that the interlayer dielectric layer to which the invention is applicable is thinner, an appropriate thickness range exists for the layer when planarity and step coverage on rugged substrate surface are taken into account. Accordingly, from the standpoints of planarity and step coverage, the photo-curable resin layer should have a thickness of 10 to 100 µm, preferably 10 to 70 µm, and more preferably 10 to 50 µm.

The photo-curable resin layer exhibits a sufficient fluidity to fill deeply even in a narrow gap.

Accordingly, the photo-curable dry film has the advantage that when tightly attached to a substrate having asperities on its surface, the photo-curable resin layer is coated so as to conform to the asperities, achieving high planarity. Particularly because the photo-curable resin layer is composed mainly of a silicone structure-bearing polymer, higher planarity is achievable owing to the advantage of low surface tension. Further, if the photo-curable resin layer is in close contact with the substrate in a vacuum environment, generation of gaps therebetween is effectively inhibited.

In the photo-curable dry film, the photo-curable resin composition used to form the photo-curable resin layer may be prepared like the chemically amplified negative resist composition defined above, specifically by combining the selected components, stirring, and filtering through a filter.

The support film used in the photo-curable dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38x1-A3, PET38x1-V8 and PET38x1-X08 from Nippa Co., Ltd.

The protective film used in the photo-curable dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 µm, more preferably 25 to 50 µm, for consistent manufacture of photo-curable dry film, and prevention of wrapping or curling on a take-up roll.

Next, it is described how to manufacture the photo-curable dry film. An apparatus for manufacturing the photo-curable dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three-roll bottom reverse coater, and four-roll bottom reverse coater.

The support film is unwound from a supply roll in the film coater, passed across the head of the film coater where the photo-curable resin composition is coated onto the support film to the predetermined buildup, and then moved through a hot air circulating oven at a predetermined temperature for a predetermined time, where the photo-curable resin layer is dried on the support film. Thereafter, the support film having the photo-curable resin layer thereon and a protective film which is unwound from another supply roll in the film coater are passed across a laminate roll under a predetermined pressure whereby the protective film is bonded to the photo-curable resin layer on the support film, whereupon the laminate is wound up on a take-up shaft in the film coater. Preferably, the oven temperature is 25 to 150° C., the time is 1 to 100 minutes, and the bonding pressure is 0.01 to 5 MPa.

Pattern Forming Process

A further embodiment is a pattern forming process using the chemically amplified negative resist composition defined above.

Any well-known lithography may be used in forming a pattern using the negative resist composition. Specifically, the resist composition is applied onto a substrate such as silicon wafer, $SiO_2$ substrate or SiN substrate or a substrate having a pattern (e.g., copper wirings) formed thereon, by a well-known technique, typically spin coating, and prebaked at 80 to 130° C. for 50 to 600 seconds to form a resist film having a thickness of 1 to 50 µm, preferably 1 to 30 µm, and more preferably 5 to 20 µm. Then a mask having the desired pattern is placed above the resist film, which is exposed to high-energy radiation having a wavelength of 190 to 500 nm, typically i- or g-line, in a dose of 1 to 5,000 mJ/cm$^2$, preferably 100 to 2,000 mJ/cm$^2$. This may be followed by bake (PEB) on a hot plate at 60 to 150° C. for 1 to 10 minutes, preferably at 80 to 120° C. for 1 to 5 minutes. As a result of exposure, an insolubilized pattern is formed in which the exposed region of resist film is crosslinked and becomes insoluble in a solvent as developer.

Following the exposure or exposure and PEB, the resist film is developed in a developer. The developer may be the solvent used in the preparation of the chemically amplified negative resist composition. Suitable solvents include alcohols such as isopropyl alcohol (IPA), ketones such as cyclohexanone, and glycols such as propylene glycol monomethyl ether. Development is effected in a conventional manner, for example, by dipping the pattern-bearing substrate in the developer. The development is followed by washing, rinsing and drying if necessary. There is obtained a coating or photo-curable resin layer having the desired pattern. Although the pattern forming process has been described, it is sometimes unnecessary to form a pattern. When it is simply desired to form a uniform film, for example, the same process as above may be followed except that the photomask is not used.

If desired, the patterned coating may be post-cured by heating in an oven or hot plate at 100 to 250° C., preferably 150 to 220° C., and more preferably 170 to 190° C. Post-curing at a temperature of 100 to 250° C. is effective for increasing the crosslinking density of the photo-curable resin composition coating and removing the residual volatile matter. Then a coating having augmented adhesion to substrates, heat resistance, high strength and good electrical properties can be formed. The post-curing time may range from 10 minutes to 10 hours.

Since the cured coating obtained from the photo-curable resin composition in the above-described way has flexibility, substrate adhesion, heat resistance, electrical properties, mechanical properties, and chemical resistance in solder flux fluids, it can be advantageously used as a protective film on electric and electronic components and semiconductor devices. Semiconductor devices covered with the protective films remain reliable. In a thermal cycling test of the protective films, no cracks form.

Further, the pattern forming process using the photo-curable dry film is described. The process involves the steps of stripping the protective film from the photo-curable dry film, placing the bare photo-curable resin layer in close contact with a substrate, exposing the photo-curable resin layer to radiation, bake (PEB), developing and optionally post-curing to form a pattern of the layer. In this way, a protective film for electric and electronic parts is obtained.

Specifically, the photo-curable dry film is first placed in close contact with a substrate using a film attachment apparatus. The substrate used herein may be selected from silicon wafers, TSV silicon wafers, plastic, ceramic and metallic circuit boards. A typical substrate is provided with holes or grooves having an opening width of 10 to 100 μm and a depth of 10 to 120 μm. The film attachment apparatus is preferably a vacuum laminator. The photo-curable dry film is mounted in the film attachment apparatus where the protective film is stripped from the dry film. In the vacuum chamber kept at a predetermined vacuum, the bare photo-curable resin layer of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa. After bonding, any well-known lithography may be performed to form a pattern.

At this point, the assembly of the photo-curable resin layer on the substrate may be prebaked, if necessary, for facilitating photo-cure reaction of the photo-curable resin layer or enhancing the adhesion between the photo-curable resin layer and the substrate. Prebake may be, for example, at 40 to 140° C. for 1 minute to 1 hour. Next, the photo-curable resin layer, with the support film or with the support film stripped off, is exposed to radiation of wavelength 190 to 500 nm through a photomask. The photomask may be, for example, a mask with a desired pattern perforated. The material of the photomask is preferably capable of cutting off radiation of wavelength 190 to 500 nm. For example, chromium or the like is preferably used, but the mask material is not limited thereto. The radiation of wavelength 190 to 500 nm includes radiation of various wavelengths emitted by a radiation emitter, for example, UV radiation such as g and i-lines, and deep UV radiation (193 nm and 248 nm). The preferred wavelength is from 248 nm to 436 nm. The exposure dose is preferably 10 to 3,000 mJ/cm$^2$, for example. Through this exposure, the exposed region is crosslinked and insolubilized in a developer, forming an insolubilized pattern. To enhance the development sensitivity, the layer may be baked (PEB). The PEB may be, for example, 40 to 140° C. for 0.5 to 10 minutes.

This is followed by development in a developer. The developer used herein may be the solvent for the photo-curable resin composition used in the formation of the photo-curable resin layer in the photo-curable dry film. The developer is preferably selected from alcohols such as isopropyl alcohol (IPA), ketones such as cyclohexanone, and glycols such as propylene glycol monomethyl ether. The development may be carried out in a conventional manner, for example, by immersing the resin layer-bearing substrate in the developer. This is followed by optional cleaning, rinsing and drying, obtaining a film in the form of the photo-curable resin layer having the desired pattern. Where a pattern need not be formed, for example, merely a uniform film is to be formed, the same procedure as the above pattern forming procedure may be employed except that the photomask is not used.

Further, the patterned layer may be post-cured by heating in an oven or on a hot plate at a temperature of 100 to 250° C., preferably 150 to 220° C., and more preferably 170 to 190° C. The post-cure temperature of 100 to 250° C. is sufficient to increase the crosslinking density of the layer of the photo-curable resin composition, to remove any residual volatiles, and to enhance adhesion to substrate, heat resistance, strength, and electric properties. The post-cure time may be 10 minutes to 10 hours.

The thus cured film also possesses flexibility, adhesion to substrate, heat resistance, electric properties, mechanical strength, and resistance to chemicals, typically solder flux. When used as protective film, the cured film provides semiconductor devices with reliability and prevents crack formation in a thermal cycling test. The cured film is thus best suited as protective film for electric and electronic parts, semiconductor devices, and the like.

Also contemplated herein are a laminate comprising a substrate provided with grooves and/or holes having an opening width of 10 to 100 μm and a depth of 10 to 120 μm, and a layer lying on the substrate, the layer being a cured layer of the photo-curable resin composition extracted from the photo-curable dry film defined above; and an electric/electronic part protective film comprising the cured film obtained by the pattern forming process defined above.

EXAMPLE

Synthesis Examples, Examples and Comparative Examples are given below by way of illustration and not by way of limitation. All parts are by weight (pbw).

I. Preparation of Photo-Curable Resin Composition

In Synthesis Examples below, compounds M-1 to M-11 having the chemical structure shown below were used.

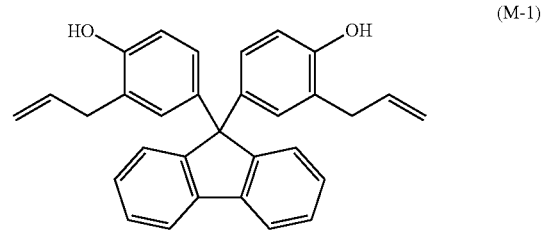

(M-1)

-continued (M-2) 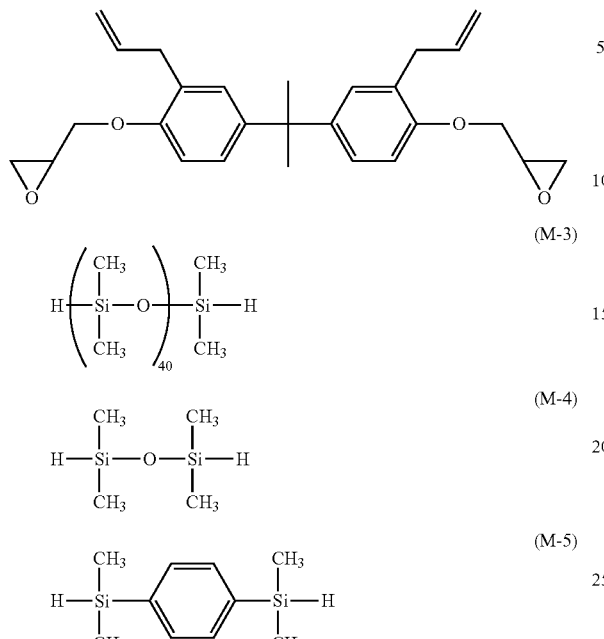

(M-3) (M-4) (M-5) 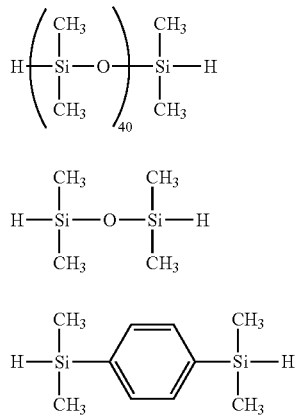

(M-6) 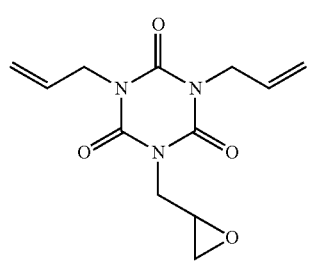

(M-7) 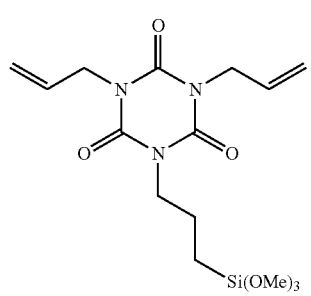

(M-8) 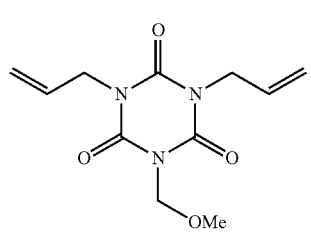

-continued (M-9), (M-10), (M-11) 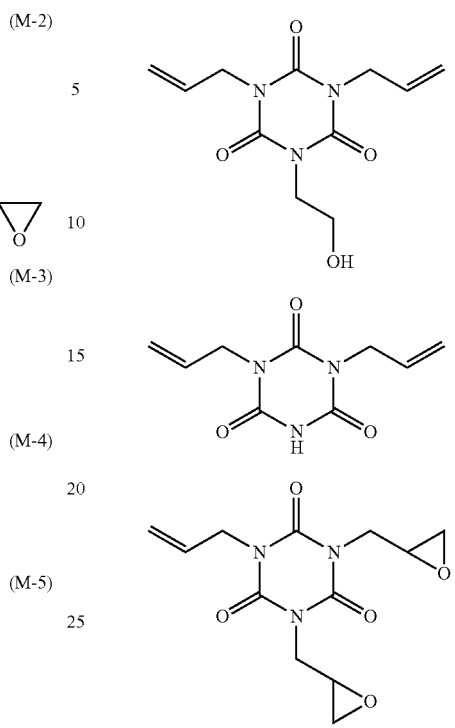

Me stands for methyl.

Synthesis Example 1

In a 2-L flask equipped with a stirrer, thermometer, nitrogen purging line and reflux condenser, 118 g of compound M-1 was dissolved in 700 g of toluene. To the solution, 50.3 g of compound M-2, 353.2 g of compound M-3, 2.3 g of compound M-4, and 1.1 g of compound M-6 were added, and it was heated at 60° C. To the flask, 0.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.8 g of platinum-on-carbon catalyst (5 wt %) was admitted, and 40.4 g of compound M-5 was added dropwise over 25 minutes. At this point, the flask internal temperature rose to 65-67° C. After the dropwise addition, the reaction solution was ripened for 3 hours at 90° C. and then cooled to room temperature. Then 637.5 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 975 g of cyclopentanone was added. The solution was concentrated in vacuum, yielding a silicone structure-bearing polymer solution (A-1) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-6 extinguished on GPC analysis, indicating that compound M-6 was incorporated into the polymer. The polymer corresponded to formula (1) wherein molar fractions a=0.395, b=0.263, c=0.198, d=0.132, e=0.007, and f=0.005 as computed from the charges of reactants.

Synthesis Example 2

In a 2-L flask equipped with a stirrer, thermometer, nitrogen purging line and reflux condenser, 100 g of compound M-1 was dissolved in 700 g of toluene. To the solution, 82.9 g of compound M-2, 321.8 g of compound M-3, 2.6 g of compound M-4, and 1.1 g of compound M-6 were added, and it was heated at 60° C. To the flask, 0.7 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.7 g of platinum-on-carbon catalyst (5 wt %) was admitted, and 53.0 g of compound M-5 was added dropwise over 25 minutes. At this point, the flask internal temperature rose to 65-67° C. After the dropwise addition, the reaction solution was ripened for 3 hours at 90° C. and then cooled to room temperature. Then 650 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 875 g of cyclopentanone was added. The solution was concentrated in vacuum, yielding a silicone structure-bearing polymer solution (A-2) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-6 extinguished on GPC analysis, indicating that compound M-6 was incorporated into the polymer. The polymer corresponded to formula (1) wherein a=0.341, b=0.161, c=0.332, d=0.156, e=0.007, and f=0.003.

Synthesis Example 3

In a 10-L flask equipped with a stirrer, thermometer, nitrogen purging line and reflux condenser, 400 g of compound M-1 was dissolved in 2,900 g of toluene. To the solution, 340.1 g of compound M-2, 943.5 g of compound M-3, 10.9 g of compound M-4, and 3.9 g of compound M-6 were added, and it was heated at 60° C. To the flask, 3.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 3.8 g of platinum-on-carbon catalyst (5 wt %) was admitted, and 232.7 g of compound M-5 was added dropwise over 1 hour. At this point, the flask internal temperature rose to 67-70° C. After the dropwise addition, the reaction solution was ripened for 3 hours at 90° C. and then cooled to room temperature. Then 2,940 g of methyl isobutyl ketone was added. The reaction solution was filtered through a filter under pressure to remove the platinum catalyst. To the silicone structure-bearing polymer solution thus obtained, 1,315 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 3,500 g of cyclopentanone was added. The solution was concentrated in vacuum, yielding a silicone structure-bearing polymer solution (A-3) in cyclopentanone having a resin solids concentration of 65-70 wt %. The silicone structure-bearing polymer in the solution was measured for molecular weight by GPC versus polystyrene standards, finding a Mw of 50,000. Also, the peaks assigned to compound M-6 extinguished on GPC analysis, indicating that compound M-6 was incorporated into the polymer. The polymer corresponded to formula (1) wherein a=0.371, b=0.131, c=0.361, d=0.127, e=0.007, and f=0.003.

Synthesis Example 4

Synthesis was carried out as in Synthesis Example 1 aside from using 1.1 g of compound M-7 instead of compound M-6, yielding a silicone structure-bearing polymer solution (A-4) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-7 extinguished, indicating that compound M-7 was incorporated into the polymer. The polymer corresponded to formula (1) wherein a=0.395, b=0.263, c=0.198, d=0.132, e=0.007, and f=0.005.

Synthesis Example 5

Synthesis was carried out as in Synthesis Example 1 aside from using 1.1 g of compound M-8 instead of compound M-6, yielding a silicone structure-bearing polymer solution (A-5) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-8 extinguished, indicating that compound M-8 was incorporated into the polymer. The polymer corresponded to formula (1) wherein a=0.395, b=0.263, c=0.198, d=0.132, e=0.007, and f=0.005.

Synthesis Example 6

Synthesis was carried out as in Synthesis Example 1 aside from using 1.1 g of compound M-9 instead of compound M-6, yielding a silicone structure-bearing polymer solution (A-6) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-9 extinguished, indicating that compound M-9 was incorporated into the polymer. The polymer corresponded to formula (1) wherein a=0.395, b=0.263, c=0.198, d=0.132, e=0.007, and f=0.005.

Synthesis Example 7

Synthesis was carried out as in Synthesis Example 1 aside from using 1.1 g of compound M-10 instead of compound M-6, yielding a silicone structure-bearing polymer solution (A-7) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-10 extinguished, indicating that compound M-10 was incorporated into the polymer. The polymer corresponded to formula (1) wherein a=0.395, b=0.263, c=0.198, d=0.132, e=0.007, and f=0.005.

Synthesis Example 8

In a 2-L flask equipped with a stirrer, thermometer, nitrogen purging line and reflux condenser, 118 g of compound M-1 was dissolved in 700 g of toluene. To the solution, 50.3 g of compound M-2, 353.2 g of compound M-3, and 2.3 g of compound M-4 were added, and it was heated at 60° C. To the flask, 0.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.8 g of platinum-on-carbon catalyst (5 wt %) was admitted, and 40.4 g of compound M-5 was added dropwise over 25 minutes. At this point, the flask internal temperature rose to 65-67° C. After the dropwise addition, 1.1 g of compound M-11 was added, and the reaction solution was ripened for 3 hours at 90° C. and then cooled to room temperature. Then 637.5 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 975 g of cyclopentanone was added. The solution was concentrated in vacuum, yielding a silicone structure-bearing polymer solution (A-8) in cyclopentanone having a resin solids concentration of 65-70 wt %. The silicone structure-bearing polymer in the solution was measured for molecular weight by GPC versus polystyrene standards, finding a Mw of 45,000. Also, the peaks assigned to compound M-11 extinguished on GPC analysis, indicating that compound M-11 was incorporated into the polymer. The polymer corresponded to formula (1) wherein a=0.395, b=0.263, c=0.198, d=0.132, e=0.007, and f=0.005.

Synthesis Example 9

Synthesis was carried out as in Synthesis Example 1 aside from using 2.2 g of compound M-6, yielding a silicone structure-bearing polymer solution (A-9) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-6 extinguished, indicating that compound M-6 was incorporated into the polymer. The polymer corresponded to formula (1) wherein a=0.391, b=0.260, c=0.196, d=0.130, e=0.014, and f=0.009.

Synthesis Example 10

In a 2-L flask equipped with a stirrer, thermometer, nitrogen purging line and reflux condenser, 118 g of compound M-1 was dissolved in 700 g of toluene. To the solution, 50.3 g of compound M-2, 477.3 g of compound M-3, 3.1 g of compound M-4, and 35 g of compound M-6 were added, and it was heated at 60° C. To the flask, 0.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.8 g of platinum-on-carbon catalyst (5 wt %) was admitted, and 54.5 g of compound M-5 was added dropwise over 30 minutes. At this point, the flask internal temperature rose to 65-67° C. After the dropwise addition, the reaction solution was ripened for 3 hours at 90° C. and then cooled to room temperature. Then 637.5 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 975 g of cyclopentanone was added. The solution was concentrated in vacuum, yielding a silicone structure-bearing polymer solution (A-10) in cyclopentanone having a resin solids concentration of 65-70 wt %. The silicone structure-bearing polymer in the solution was measured for molecular weight by GPC versus polystyrene standards, finding a Mw of 52,000. Also, the peaks assigned to compound M-6 extinguished on GPC analysis, indicating that compound M-6 was incorporated into the polymer. The polymer corresponded to formula (1) wherein a=0.292, b=0.195, c=0.146, d=0.098, e=0.161, and f=0.108.

Comparative Synthesis Example 1

In a 2-L flask equipped with a stirrer, thermometer, nitrogen purging line and reflux condenser, 118 g of compound M-1 was dissolved in 700 g of toluene. To the solution, 50.3 g of compound M-2, 353.2 g of compound M-3, and 2.3 g of compound M-4 were added, and it was heated at 60° C. To the flask, 0.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.8 g of platinum-on-carbon catalyst (5 wt %) was admitted, and 40.4 g of compound M-5 was added dropwise over 25 minutes. At this point, the flask internal temperature rose to 65-67° C. After the dropwise addition, the reaction solution was ripened for 3 hours at 90° C. and then cooled to room temperature. Then 637.5 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 975 g of cyclopentanone was added. The solution was concentrated in vacuum, yielding a silicone structure-bearing polymer solution (A-11) in cyclopentanone having a resin solids concentration of 65-70 wt %. The silicone structure-bearing polymer in the solution was measured for molecular weight by GPC versus polystyrene standards, finding a Mw of 52,000. The polymer corresponded to formula (1) wherein a=0.400, b=0.266, c=0.200, and d=0.134.

Comparative Synthesis Example 2

In a 2-L flask equipped with a stirrer, thermometer, nitrogen purging line and reflux condenser, 100 g of compound M-1 was dissolved in 700 g of toluene. To the solution, 82.9 g of compound M-2, 321.8 g of compound M-3, and 2.6 g of compound M-4 were added, and it was heated at 60° C. To the flask, 0.7 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 0.7 g of platinum-on-carbon catalyst (5 wt %) was admitted, and 53.0 g of compound M-5 was added dropwise over 25 minutes. At this point, the flask internal temperature rose to 65-67° C. After the dropwise addition, the reaction solution was ripened for 3 hours at 90° C. and then cooled to room temperature. Then 650 g of methyl isobutyl ketone was added. The reaction solution was filtered through a filter under pressure to remove the platinum catalyst. To the silicone structure-bearing polymer solution thus obtained, 285 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 875 g of cyclopentanone was added. The solution was concentrated in vacuum, yielding a silicone structure-bearing polymer solution (A-12) in cyclopentanone having a resin solids concentration of 65-70 wt %. The silicone structure-bearing polymer in the solution was measured for molecular weight by GPC versus polystyrene standards, finding a Mw of 52,000. The polymer corresponded to formula (1) wherein a=0.345, b=0.162, c=0.335, and d=0.158.

Comparative Synthesis Example 3

In a 10-L flask equipped with a stirrer, thermometer, nitrogen purging line and reflux condenser, 400 g of compound M-1 was dissolved in 2,900 g of toluene. To the solution, 340.1 g of compound M-2, 943.5 g of compound M-3, and 10.9 g of compound M-4 were added, and it was heated at 60° C. To the flask, 3.8 g of platinum-on-carbon catalyst (5 wt %) was admitted whereupon the internal reaction temperature rose to 65-67° C. After confirmation of this temperature rise, the flask was heated at 90° C. for 3 hours and cooled to 60° C. again. To the flask, 3.8 g of platinum-on-carbon catalyst (5 wt %) was admitted, and 232.7 g of compound M-5 was added dropwise over 1 hour. At this point, the flask internal temperature rose to 65-67° C. After the dropwise addition, the reaction solution was ripened for 3 hours at 90° C. and then cooled to room temperature. Then 2,940 g of methyl isobutyl ketone was added. The reaction solution was filtered through a filter under pressure to remove the platinum catalyst. To the silicone structure-bearing polymer solution thus obtained, 1,315 g of deionized water was added, followed by stirring and stationary holding for separation. The lower layer or water layer was removed. This washing/separatory operation was repeated 6 times, thereby removing the trace acid value from the silicone structure-bearing polymer solution. The solvent was distilled off in vacuum from the silicone structure-bearing polymer solution and instead, 3,500 g of cyclopentanone was added. The solution was concentrated in vacuum, yielding a silicone structure-bearing polymer solution (A-13) in cyclopentanone having a resin solids concentration of 65-70 wt %. The silicone structure-bearing polymer in the solution was measured for molecular weight by GPC versus polystyrene standards, finding a Mw of 50,000. The polymer corresponded to formula (1) wherein a=0.375, b=0.132, c=0.365, and d=0.128.

Examples and Comparative Examples

Resist compositions #1 to #12 were prepared from the resin solutions of Synthesis Examples 1 to 10. The resin solution was combined with a crosslinker, PAG, an amine compound, and cyclopentanone as additional solvent in amounts as shown in Table 1, yielding a resist composition having a solids concentration of 45 wt %. The procedure involved stirring and mixing for dissolution and precision filtration through a Teflon® filter with a pore size of 0.5 μm.

In Comparative Examples, resist compositions #13 to #15 were prepared by combining the resin solutions of Comparative Synthesis Examples 1 to 3 with a crosslinker, PAG, amine and solvent, stirring and mixing for dissolution and precision filtering through a Teflon® filter with a pore size of 0.5 μm. The formulation of Comparative Examples is also shown in Table 1.

TABLE 1

| Photo-curable resin composition | Silicone structure-bearing polymer (pbw) | PAG (pbw) | Crosslinker (pbw) | Basic compound (pbw) |
|---|---|---|---|---|
| #1 | A-1 (100) | PAG-1 (0.5) | XL-1 (7) | Amine-1 (0.50) |
| #2 | A-2 (100) | PAG-1 (0.5) | XL-1 (7) | Amine-1 (0.50) |
| #3 | A-3 (100) | PAG-1 (0.5) | XL-1 (7) | Amine-1 (0.50) |
| #4 | A-4 (100) | PAG-1 (0.5) | XL-1 (7) | Amine-1 (0.50) |
| #5 | A-5 (100) | PAG-1 (0.5) | XL-1 (7) | Amine-1 (0.50) |
| #6 | A-6 (100) | PAG-1 (0.5) | XL-1 (7) | Amine-1 (0.50) |
| #7 | A-7 (100) | PAG-1 (0.5) | XL-1 (7) | Amine-1 (0.50) |
| #8 | A-8 (100) | PAG-1 (0.5) | XL-1 (7) | Amine-1 (0.50) |
| #9 | A-9 (100) | PAG-1 (0.5) | XL-1 (7) | Amine-1 (0.50) |
| #10 | A-10 (100) | PAG-1 (0.5) | XL-1 (15) | Amine-1 (0.50) |
| #11 | A-2 (100) | PAG-1 (0.5) | XL-1 (15) | Amine-1 (0.50) |
| #12 | A-2 (100) | PAG-1 (0.5) | XL-2 (10) | Amine-1 (0.50) |
| #13* | A-11 (100) | PAG-1 (0.5) | XL-1 (7) | Amine-1 (0.50) |
| #14* | A-12 (100) | PAG-1 (0.5) | XL-1 (7) | Amine-1 (0.50) |
| #15* | A-13 (100) | PAG-1 (0.5) | XL-1 (7) | Amine-1 (0.50) |

*Comparative Example

The acid generator PAG-1, crosslinker XL-1, XL-2, and basic compound Amine-1 in Table 1 are identified below.

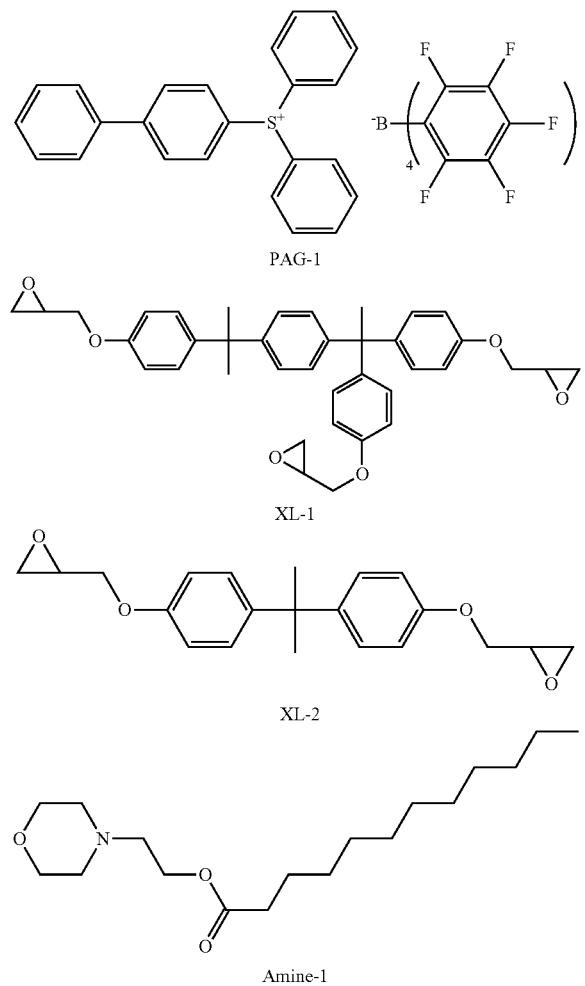

PAG-1

XL-1

XL-2

Amine-1

II. Exposure and Pattern Formation

The resist composition was coated onto a silicon substrate by spin coating. Specifically, 5 mL of the resist composition may be dispensed on the substrate, which is then spun. The buildup or thickness of the resist film on the substrate can be easily adjusted by controlling the rotational speed. The resist composition was coated onto the silicon substrate to a thickness of 20 μm.

After the resist composition was dispensed and spin coated onto the substrate, it was prebaked on a hot plate at 100° C. for 2 minutes. Next, using a mask aligner MA-8 (SUSS MicroTec AG) with a mask having a 1:1 column/row matrix of 20-μm holes, the resist film was exposed to a broad band of radiation. The substrate was baked (PEB) at 110° C. for 2 minutes and cooled. Then puddle development in isopropyl alcohol (IPA) for 1 minute was repeated 3 times for patterning the resist film. The patterned film on the substrate was post-cured in an oven at 180° C. for 2 hours while the oven was purged with nitrogen.

The resist film was similarly patterned using a SiN substrate and a Cu substrate instead of the silicon substrate.

To observe the cross-sectional profile of the resulting hole pattern, each substrate was sectioned. The profile of the hole pattern was observed under a scanning microscope (SEM).

Table 2 reports the optimum dose (dose computed as 365-nm radiation) at which the hole pattern was finished to the same size (or diameter) of holes as the mask size of 20 μm.

TABLE 2

| Film | | Photo-curable resin composition | Dose (mJ/cm$^2$) on silicon | Dose (mJ/cm$^2$) on SiN | Dose (mJ/cm$^2$) on Cu |
|---|---|---|---|---|---|
| Example | 1 | #1 | 1,200 | 1,500 | 1,700 |
| | 2 | #2 | 1,300 | 1,500 | 1,700 |
| | 3 | #3 | 1,300 | 1,500 | 1,700 |
| | 4 | #4 | 1,300 | 1,500 | 1,800 |
| | 5 | #5 | 1,200 | 1,500 | 1,700 |
| | 6 | #6 | 1,300 | 1,500 | 1,700 |
| | 7 | #7 | 1,500 | 1,700 | 1,800 |
| | 8 | #8 | 1,400 | 1,700 | 1,800 |
| | 9 | #9 | 1,300 | 1,500 | 1,700 |
| | 10 | #10 | 1,500 | 1,700 | 1,800 |
| | 11 | #11 | 1,200 | 1,300 | 1,500 |
| | 12 | #12 | 1,300 | 1,500 | 1,700 |
| Comparative Example | 1 | #13 | 1,500 | pattern stripped on development | pattern stripped on development |
| | 2 | #14 | 1,200 | pattern stripped on development | pattern stripped on development |
| | 3 | #15 | 1,300 | pattern stripped on development | pattern stripped on development |

As seen from Table 2, in an attempt to pattern a film of silicone structure-bearing polymer-free resist composition on the SiN and Cu substrates, the film substantially stripped off, that is, patterning was impossible. It is demonstrated that use of the silicone structure-bearing polymer in a resist composition is effective for improving the patterning of the resist composition and the adhesion between the film and the substrate.

III. Manufacture of Photo-Curable Dry Film

Photo-curable dry films were manufactured using the resin solutions of Synthesis Examples 1 to 10. Photo-curable resin compositions were prepared by combining the resin solution with a crosslinker, PAG, and amine compound in amounts as shown in Table 1 (no extra cyclopentanone as solvent). The procedure involved stirring and mixing for dissolution and precision filtration through a Teflon® filter with a pore size of 1.0 μm.

In Comparative Examples, photo-curable resin compositions were similarly prepared by combining the resin solutions of Comparative Synthesis Examples 1 to 3 with a crosslinker, PAG, and amine compound, stirring and mixing for dissolution and precision filtering through a Teflon® filter with a pore size of 1.0 μm.

A die coater was used as the film coater and a polyethylene terephthalate (PET) film of 38 μm thick used as the support film. Each of photo-curable resin compositions #1 to #15 in Table 1 was coated onto the support film. The coated film was passed through a hot air circulating oven (length 4 m) set at 100° C. over 5 minutes, forming a photo-curable resin layer on the support film. Using a laminating roll, a polyethylene film of 50 μm thick as the protective film was bonded to the photo-curable resin layer under a pressure of 1 MPa, yielding a photo-curable dry film.

The photo-curable resin layer had a thickness of 50 μm. Dry films in Examples and Comparative Examples are shown in Table 3.

IV. Exposure and Pattern Formation

From each of the photo-curable dry films using the photo-curable resin compositions in Examples and Comparative Examples as tabulated in Table 3, the protective film was stripped off. Using a vacuum laminator TEAM-100RF (Takatori Corp.) with a vacuum chamber set at a vacuum of 100 Pa and a temperature of 100° C., the photo-curable resin layer on the support film was closely bonded to a silicon substrate. After restoration of atmospheric pressure, the substrate was cooled to 25° C. and taken out of the laminator. The support film was stripped off.

After the support film was stripped off, the photo-curable resin layer on substrate was prebaked on a hot plate at 100° C. for 5 minutes. Next, using a mask aligner MA-8 (SUSS MicroTec AG) with a mask having a 1:1 column/row matrix of 40-μm holes, the resin layer was exposed to a broad band of radiation. The substrate was baked (PEB) at 130° C. for 5 minutes and cooled. This was followed by spray development in propylene glycol monomethyl ether acetate (PGMEA) for 5 minutes for patterning the resin layer. The patterned layer on the substrate was post-cured in an oven at 180° C. for 2 hours while the oven was purged with nitrogen.

The photo-curable dry film was similarly laminated and patterned using a SiN substrate and a Cu substrate instead of the silicon substrate.

To observe the cross-sectional profile of the resulting hole pattern, each substrate was sectioned. The profile of the hole pattern was observed under SEM. Table 3 reports the optimum dose (dose computed as 365-nm radiation) at which the hole pattern was finished to the same size (or diameter) of holes as the mask size of 40 μm.

TABLE 3

| Film | | Photo-curable resin composition | Dose (mJ/cm$^2$) on silicon | Dose (mJ/cm$^2$) on SiN | Dose (mJ/cm$^2$) on Cu |
|---|---|---|---|---|---|
| Example | 13 | #1 | 1,400 | 1,600 | 1,800 |
| | 14 | #2 | 1,400 | 1,600 | 1,800 |
| | 15 | #3 | 1,500 | 1,700 | 1,800 |
| | 16 | #4 | 1,500 | 1,600 | 1,900 |
| | 17 | #5 | 1,400 | 1,700 | 1,800 |
| | 18 | #6 | 1,500 | 1,600 | 1,900 |
| | 19 | #7 | 1,700 | 2,000 | 2,100 |
| | 20 | #8 | 1,500 | 2,000 | 2,100 |
| | 21 | #9 | 1,400 | 1,600 | 1,800 |
| | 22 | #10 | 1,700 | 2,000 | 2,100 |
| | 23 | #11 | 1,300 | 1,400 | 1,700 |
| | 24 | #12 | 1,500 | 1,600 | 1,900 |
| Comparative Example | 4 | #13 | 1,700 | pattern stripped on development | pattern stripped on development |
| | 5 | #14 | 1,400 | pattern stripped on development | pattern stripped on development |
| | 6 | #15 | 1,500 | pattern stripped on development | pattern stripped on development |

As seen from Table 3, in an attempt to laminate and pattern a photo-curable dry film comprising a silicone structure-bearing polymer-free composition on the SiN and Cu substrates, the film substantially stripped off, that is, patterning was impossible. It is demonstrated that the use of the silicone structure-bearing polymer in a resin composition is effective for improving the patterning of the photo-curable dry film and the adhesion between the pattern (or film) and the substrate.

V. Filling Capability

There were provided 6-inch silicon wafers which each were perforated with 200 circular holes having an opening diameter of 10 to 100 μm (increment 10 μm) and a depth of 10 to 120 μm (increment 10 μm). The photo-curable dry films of Examples 13, 14 and 15 were chosen from Table 3. The protective film was stripped off from each of the photo-curable dry films. Using a vacuum laminator TEAM-100RF (Takatori Corp.) with a vacuum chamber set at a vacuum of 100 Pa and a temperature of 100° C., the photo-curable resin layer on the support film was closely bonded to the silicon substrate. After restoration of atmospheric pressure, the substrate was cooled to 25° C. and taken out of the laminator. The support film was stripped off.

After the support film was stripped off, the photo-curable resin layer on substrate was prebaked on a hot plate at 100° C. for 5 minutes. Next, using a mask aligner MA-8 (SUSS MicroTec AG), the resin layer was exposed to a broad band of radiation in a dose (dose computed as 365-nm radiation) as shown in Table 3. The substrate was baked (PEB) at 110° C. for 5 minutes and cooled. This was followed by spray development in PGMEA for 5 minutes for patterning the resin layer. The patterned layer on the substrate was post-cured in an oven at 180° C. for 2 hours while the oven was purged with nitrogen.

The substrate was diced so that the circular holes might be viewed in cross section. The cross section of the circular holes was observed under SEM to inspect whether or not voids were left. The results are reported in Table 4.

TABLE 4

| Film | | Photo-curable resin composition | Dose (mJ/cm$^2$) | Cross section of circular holes observed |
|---|---|---|---|---|
| Example | 13 | #1 | 1,500 | no voids, fully filled |
| | 14 | #2 | 1,500 | no voids, fully filled |
| | 15 | #3 | 1,500 | no voids, fully filled |

As seen from Table 4, the holes were fully filled without leaving voids. It is demonstrated that the photo-curable dry film, specifically photo-curable resin layer exhibits satisfactory filling or embedment as the electric/electronic part-protecting film.

VI. Electric Properties (Dielectric Breakdown Strength)

The photo-curable dry films of Examples 13, 14 and 15 (resin layer thickness 50 μm) were chosen from Table 3. After the protective film was stripped off, the photo-curable resin layer on the support film was closely bonded to a substrate (according to JIS K-6249) at a temperature of 100° C. The assembly was cooled to room temperature, after which the support film was stripped off. The photo-curable resin layer on substrate was prebaked on a hot plate at 100° C. for 5 minutes. Next, using the mask aligner, the resin layer was exposed to a broad band of radiation in a dose of 1,000 mJ/cm$^2$ (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen. The substrate having the cured layer thereon was measured for dielectric breakdown strength according to JIS K-6249, with the results shown in Table 5.

As seen from Table 5, all the layers had satisfactory electric property as the electric/electronic part-protecting film.

VII. Adhesion

The photo-curable dry films of Examples 13, 14 and 15 (resin layer thickness 50 μm) were chosen from Table 3. The protective film was stripped off. Using the vacuum laminator, the photo-curable resin layer on the support film was closely bonded to a neat 6-inch silicon wafer in a vacuum chamber set at a vacuum of 100 Pa and a temperature of 100° C. After restoration of atmospheric pressure, the substrate was cooled to 25° C. and taken out of the laminator. The support film was stripped off. Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm² (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen, yielding a patterned post-cured film having pattern features with a diameter of 300 μm and a height of 50 μm. The patterned post-cured film was evaluated for initial adhesion by peeling the film from the substrate and measuring the reaction force. The measurement conditions included a bond tester (Dage series 4000-PXY by Dage), a speed of 50.0 μm/sec, and a height of 3.0 μm.

FIG. 1 schematically illustrates how to evaluate adhesion or bond strength. A patterned post-cured film 2 is borne on a silicon substrate 1. A jig 3 of the bond tester is moved in the direction of arrow 4 to push the film. Measurements at 15 points were averaged. A higher value indicates greater adhesion of the patterned post-cured film to the substrate.

Further, a solder flux fluid was applied to the patterned post-cured film on the substrate. The film was heated at 220° C. for 30 seconds, cooled, washed with deionized water, and dried at room temperature for 2 hours. After this degradation test, the patterned post-cured film was evaluated for adhesion again by using the bond tester, peeling the film from the substrate and measuring the reaction force.

For the three photo-curable dry films, adhesion was evaluated by comparing their initial values. Chemical resistance (against solder flux) was also evaluated by comparing their adhesion behavior that the bond strength decreases from the initial value to the post-degradation value. The results are shown in Table 5.

As seen from Table 5, the layers had satisfactory adhesion as the electric/electronic part-protecting film.

VIII. Crack Resistance

The photo-curable dry films of Examples 13, 14 and 15 (resin layer thickness 50 μm) were chosen from Table 3. The protective film was stripped off. Using the vacuum laminator, the photo-curable resin layer on the support film was closely bonded to a substrate (used in the filling test) in a vacuum chamber at a vacuum of 100 Pa and a temperature of 100° C. After restoration of atmospheric pressure, the substrate was cooled to 25° C. and taken out of the laminator. The support film was stripped off.

Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm² (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen.

The substrate having the cured film thereon was placed in a thermal cycling tester where thermal cycling between −55° C. and +150° C. was repeated until 1,000 cycles. During the test, the cured film was observed whether or not cracks formed. The results are shown in Table 5.

As seen from Table 5, the layers had satisfactory crack resistance as the electric/electronic part-protecting film.

IX. Resistance to Stripper

The photo-curable dry films of Examples 13, 14 and 15 (resin layer thickness 50 μm) were chosen from Table 3. The protective film was stripped off. Using the vacuum laminator, the photo-curable resin layer on the support film was closely bonded to a neat 6-inch silicon wafer in a vacuum chamber at a vacuum of 100 Pa and a temperature of 100° C. After restoration of atmospheric pressure, the substrate was cooled to 25° C. and taken out of the laminator. The support film was stripped off.

Thereafter, the photo-curable resin layer on substrate was prebaked on a hot plate at 100° C. for 5 minutes. Next, using the mask aligner, the resin layer was exposed to a broad band of radiation in a dose of 1,000 mJ/cm² (wavelength 365 nm) through a quartz photomask. The substrate was baked (PEB) at 110° C. for 5 minutes and cooled. This was followed by spray development in PGMEA for 5 minutes. The layer on the substrate was post-cured in an oven at 180° C. for 2 hours while the oven was purged with nitrogen, yielding a cured film having a pattern of 15 mm×15 mm squares. The film was immersed in N-methylpyrrolidone (NMP) at room temperature for 1 hour. By examining film thickness change and outer appearance, the film was evaluated for stripper resistance. The results are also shown in Table 5.

As seen from Table 5, all the layers had satisfactory stripper resistance as the electric/electronic part-protecting film.

TABLE 5

| Film | | Dielectric breakdown strength (V/μm) | Adhesion (mN) | | Crack resistance after thermal cycling | Stripper resistance after immersion in NMP |
|---|---|---|---|---|---|---|
| | | | Initial | Degraded | | |
| Example | 13 | 400 | 340 | 210 | no cracks | appearance and thickness unchanged |
| | 14 | 400 | 440 | 400 | no cracks | appearance and thickness unchanged |
| | 15 | 300 | 320 | 210 | no cracks | appearance and thickness unchanged |

The invention substantially overcomes the problem associated with a negative resist composition that a hole or space pattern formed from a photo-curable dry film has a negative or inverse taper profile or an overhang profile with an extremely projecting top. The chemically amplified negative resist composition, photo-curable dry film and pattern forming process according to the invention can form a film having a wide range of thickness and form a fine pattern using radiation over a wide span of wavelength, can reduce the size of pattern features in the redistribution layer technology to meet the demand for chips of higher density and higher integration, and are useful to form an electric/electronic part-protecting film.

Japanese Patent Application No. 2012-014836 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone structure-bearing polymer comprising recurring units having the general formula (1) and having a weight average molecular weight of 3,000 to 500,000:

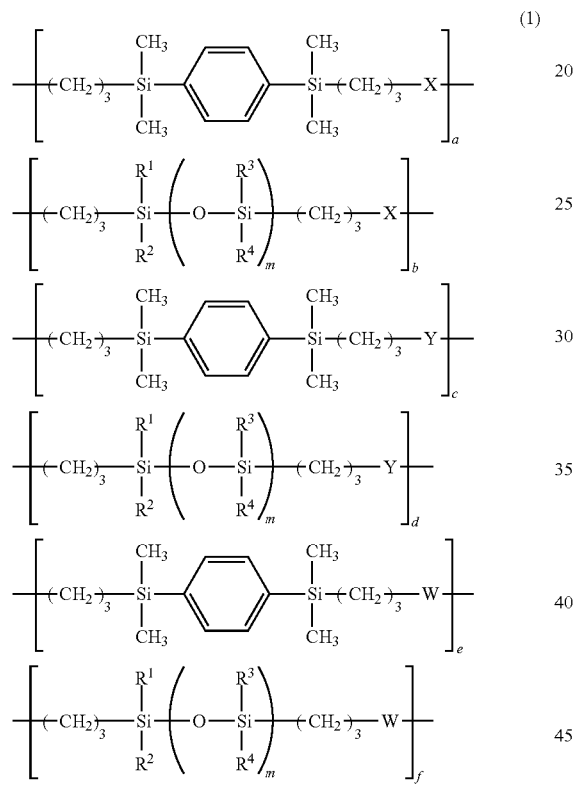

(1)

wherein $R^1$ to $R^4$ are each independently a monovalent $C_1$-$C_8$ hydrocarbon group, m is an integer of 1 to 100, a, b, c and d are each independently 0 or a positive number, e and f each are a positive number, with the proviso that a, b, c and d are not equal to 0 at the same time and a+b+c+d+e+f=1, X is a divalent organic group having the general formula (2):

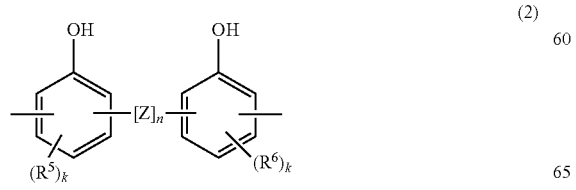

(2)

wherein Z is a divalent organic group selected from the group consisting of

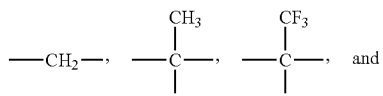

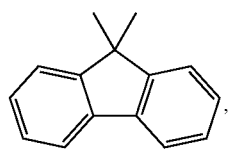

and n is 0 or 1, $R^5$ and $R^6$ are each independently a $C_1$-$C_4$ alkyl or alkoxy group, k is 0, 1 or 2, Y is a divalent organic group having the general formula (3):

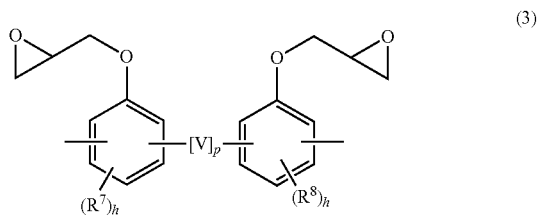

(3)

wherein V is a divalent organic group selected from the group consisting of

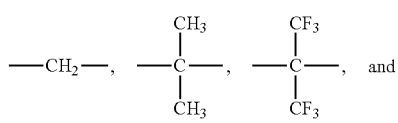

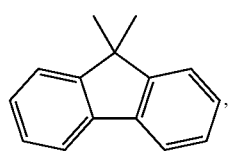

and p is 0 or 1, $R^7$ and $R^8$ are each independently a $C_1$-$C_4$ alkyl or alkoxy group, h is 0, 1 or 2, and W is a divalent organic group having the general formula (4-1) and/or a monovalent organic group having the general formula (4-2):

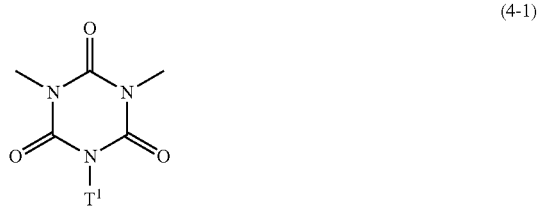

(4-1)

(4-2)

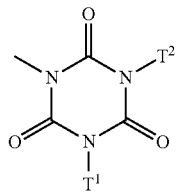

wherein $T^1$ and $T^2$ are each independently a monovalent group selected from the group consisting of

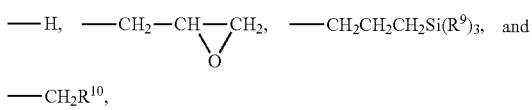

—CH$_2$R$^{10}$, $R^9$ is a $C_1$-$C_4$ alkyl or alkoxy group, and $R^{10}$ is hydrogen, a $C_1$-$C_4$ alkyl or alkoxy group, or —(CH$_2$)$_s$OH wherein s is an integer of 0 to 3.

2. The polymer of claim 1 wherein $T^1$ or $T^2$ in formulae (4-1) and (4-2) has the following formula

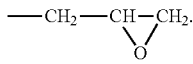

3. A method for preparing the silicone structure-bearing polymer of claim 1, comprising the step of effecting polymerization reaction of hydrogensilphenylene having the formula (5):

(5)

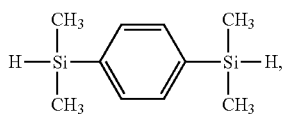

a dihydroorganosiloxane having the formula (6):

(6)

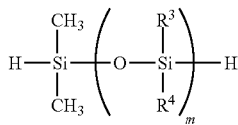

wherein $R^3$, $R^4$ and m are as defined above, a diallyl-containing epoxy compound having the formula (7):

(7)

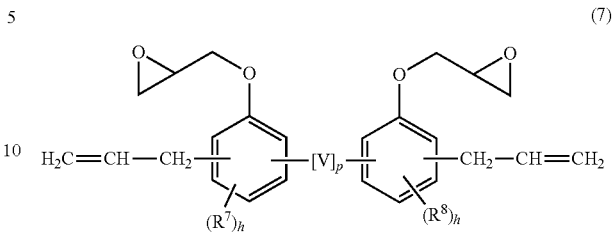

wherein V, $R^7$, $R^8$, p and h are as defined above, and/or a diallyl-containing phenol compound having the formula (8):

(8)

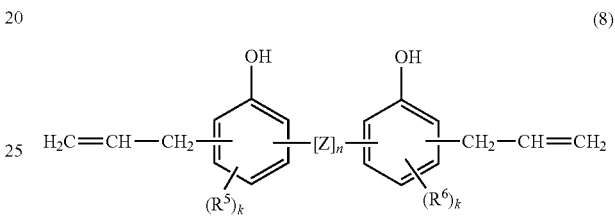

wherein Z, $R^5$, $R^6$, n and k are as defined above, and a diallyl-containing isocyanurate structure compound having the formula (9) and/or an allyl-containing isocyanurate structure compound having the formula (10):

(9)

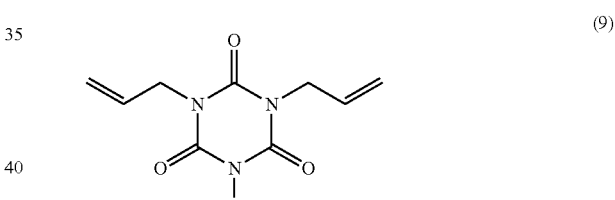

(10)

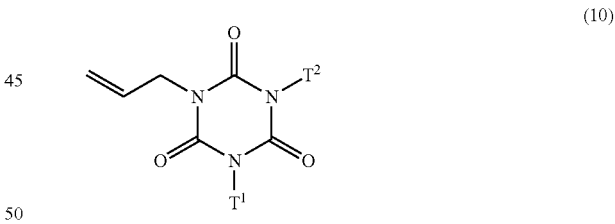

wherein $T^1$ and $T^2$ are as defined above in the presence of a catalyst.

4. The method of claim 3 wherein the isocyanurate structure compound is used in an amount of 0.1 to 10.0% by weight based on the total weight of the silicone polymer-forming reactants.

\* \* \* \* \*